(12) United States Patent
Pan et al.

(10) Patent No.: US 12,376,354 B2
(45) Date of Patent: Jul. 29, 2025

(54) SEMICONDUCTOR AND METHOD FOR MANUFACTURING THE SAME

(71) Applicant: Taiwan Semiconductor Manufacturing Company, Ltd., Hsinchu (TW)

(72) Inventors: Kuan-Ting Pan, Taipei (TW); Kuo-Cheng Chiang, Zhubei (TW); Shi-Ning Ju, Hsinchu (TW); Yi-Ruei Jhan, Keelung (TW); Wei-Ting Wang, Taipei (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 461 days.

(21) Appl. No.: 17/886,876

(22) Filed: Aug. 12, 2022

(65) Prior Publication Data

US 2024/0055479 A1 Feb. 15, 2024

(51) Int. Cl.
*H10D 62/10* (2025.01)
*H10D 30/01* (2025.01)
(Continued)

(52) U.S. Cl.
CPC ......... *H10D 62/121* (2025.01); *H10D 30/014* (2025.01); *H10D 30/43* (2025.01);
(Continued)

(58) Field of Classification Search
CPC .. H10D 30/43; H10D 30/014; H10D 30/6735; H10D 64/017; H10D 62/121; H10D 64/021; H10D 62/151; H10D 84/0128; H10D 84/013; H10D 84/0147; H10D 84/0158; H10D 84/038
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Brook Kebede
(74) *Attorney, Agent, or Firm* — Birch, Stewart, Kolasch & Birch, LLP

(57) ABSTRACT

A method for manufacturing a semiconductor structure is provided. The method includes forming a fin structure protruding from a substrate, wherein the fin structure includes first semiconductor material layers and second semiconductor material layers alternately stacked. The method includes forming a dummy gate structure across the fin structure. The method includes forming a gate spacer on the sidewall of the dummy gate structure. The method includes removing the dummy gate structure to expose the fin structure. The method includes partially removing the second semiconductor material layers to form concave portions on sidewalls of the second semiconductor material layers. The method includes forming dielectric spacers in the concave portions. The method includes removing the first semiconductor material layers to form gaps. The method includes forming a gate structure in the gaps to wrap around the second semiconductor material layers and the dielectric spacers.

20 Claims, 34 Drawing Sheets

(51) Int. Cl.
  *H10D 30/43* (2025.01)
  *H10D 30/67* (2025.01)
  *H10D 62/13* (2025.01)
  *H10D 64/01* (2025.01)
  *H10D 84/01* (2025.01)
  *H10D 84/03* (2025.01)

(52) U.S. Cl.
  CPC ....... *H10D 30/6735* (2025.01); *H10D 62/151* (2025.01); *H10D 64/017* (2025.01); *H10D 64/021* (2025.01); *H10D 84/0128* (2025.01); *H10D 84/013* (2025.01); *H10D 84/0147* (2025.01); *H10D 84/0158* (2025.01); *H10D 84/038* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2021/0202758 A1* | 7/2021 | Yeong ................. H01L 27/0886 |
| 2022/0293760 A1* | 9/2022 | Hung ................. H10D 84/038 |

* cited by examiner

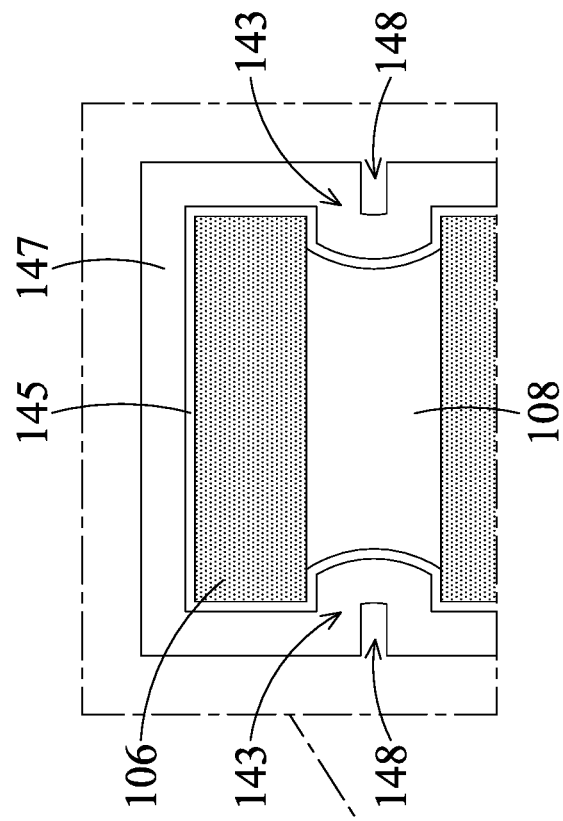
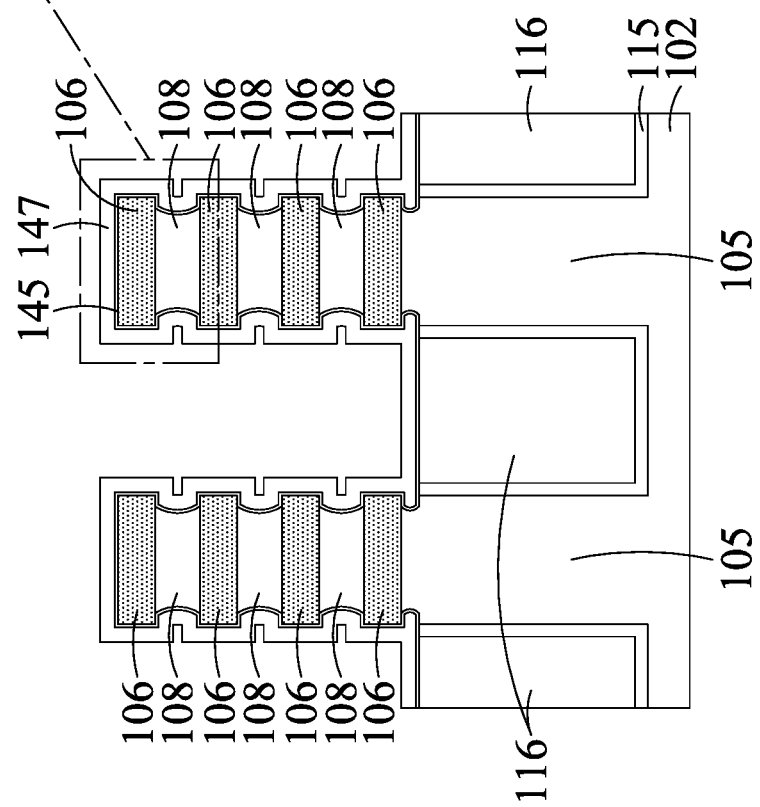

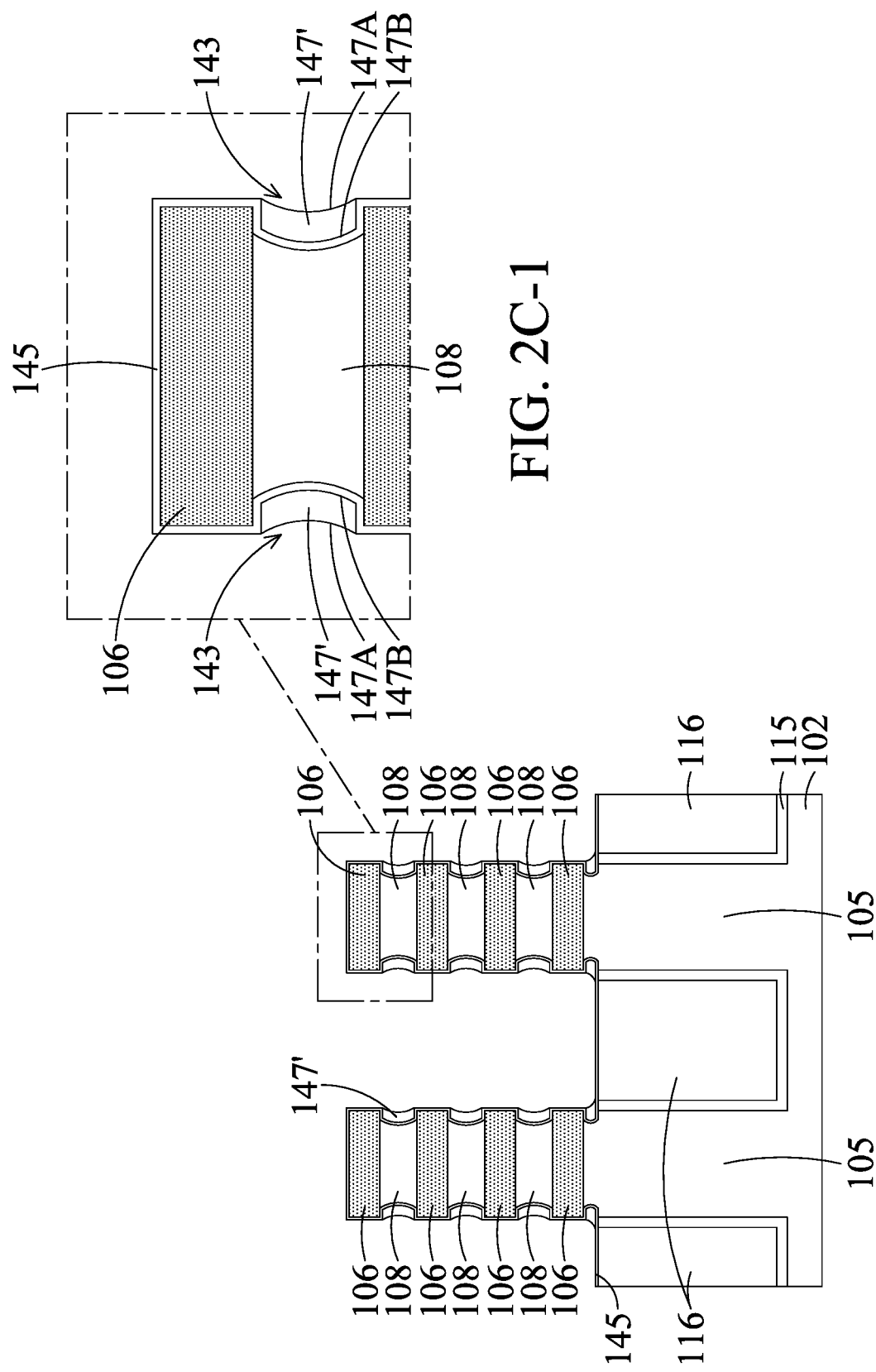

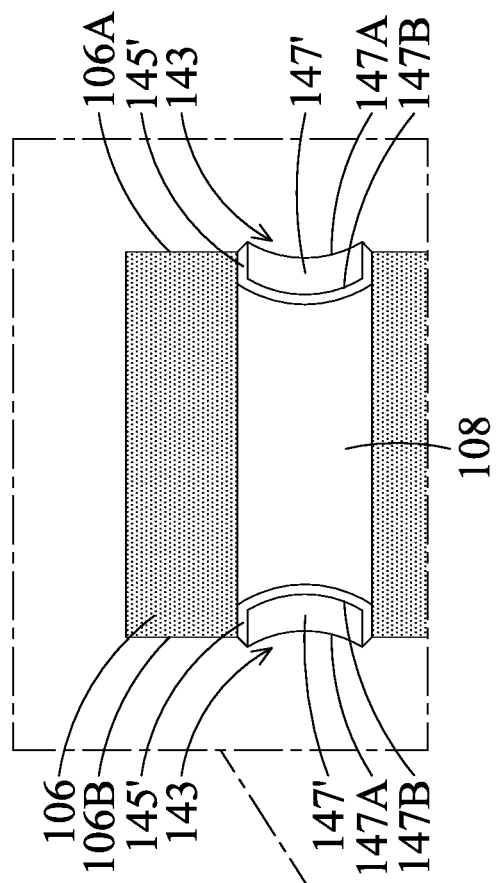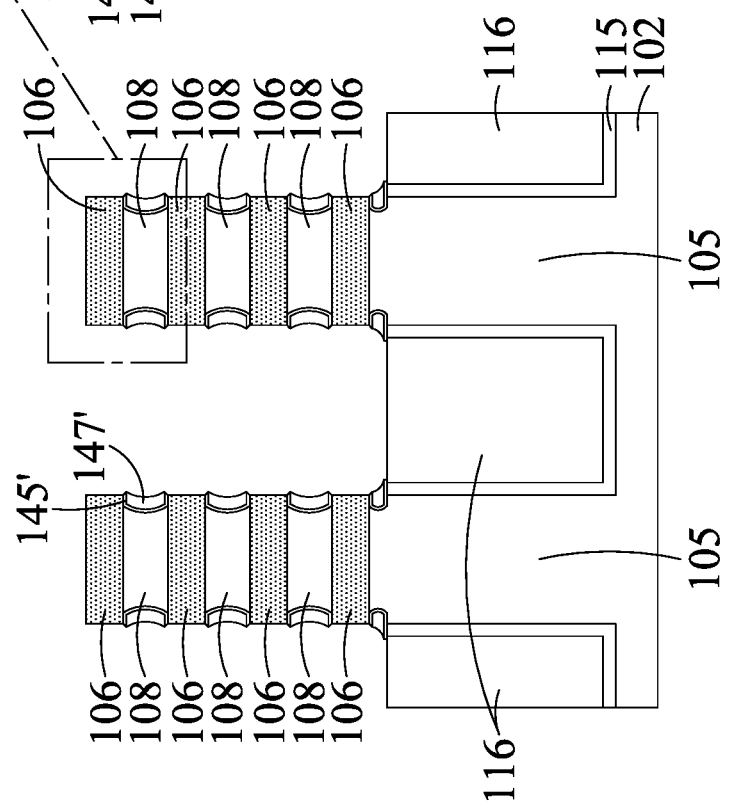
FIG. 2D-1
FIG. 2D

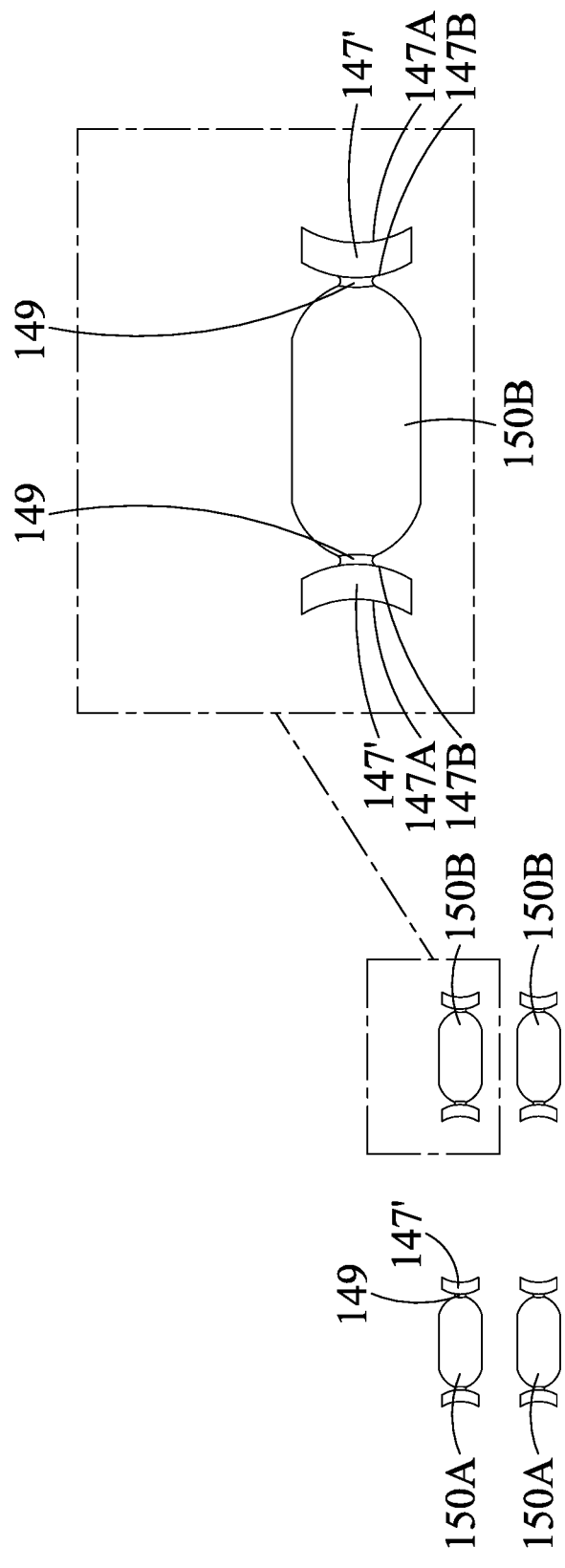
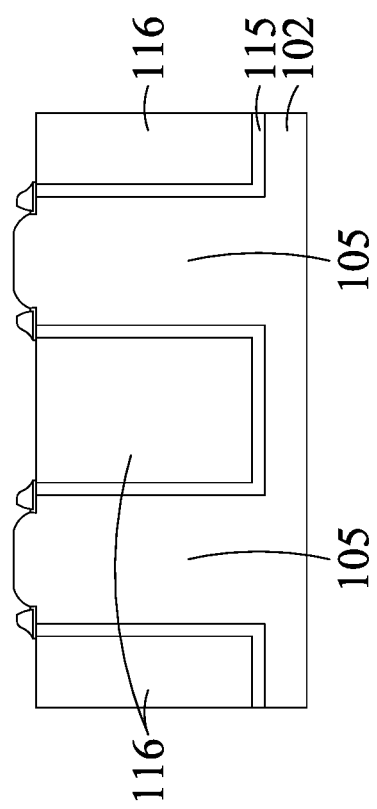
FIG. 2E-1
FIG. 2E

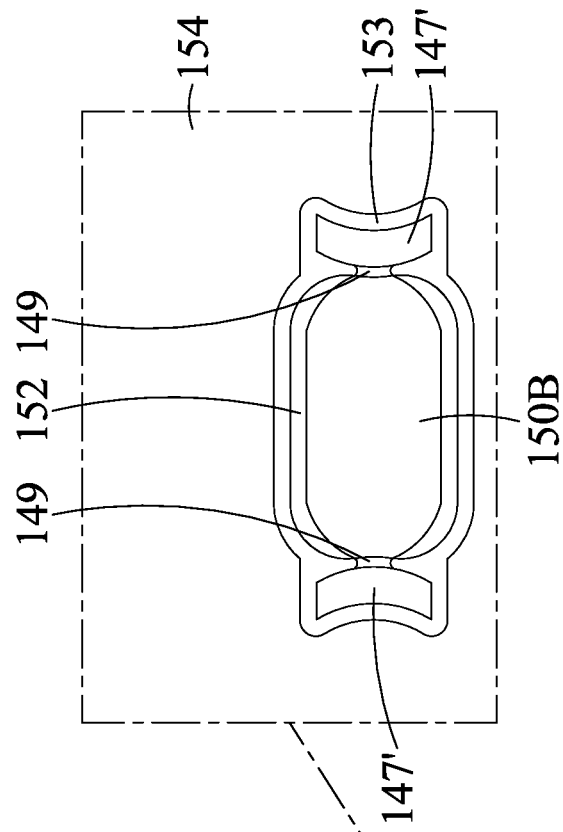
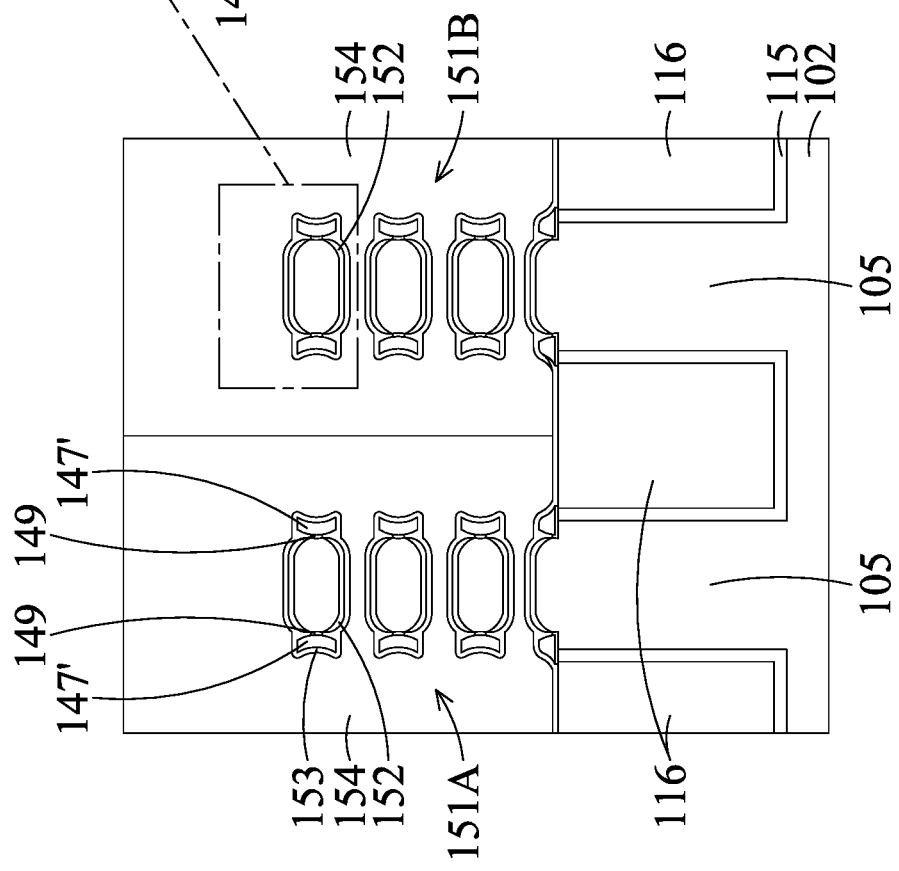
FIG. 2F-1
FIG. 2F

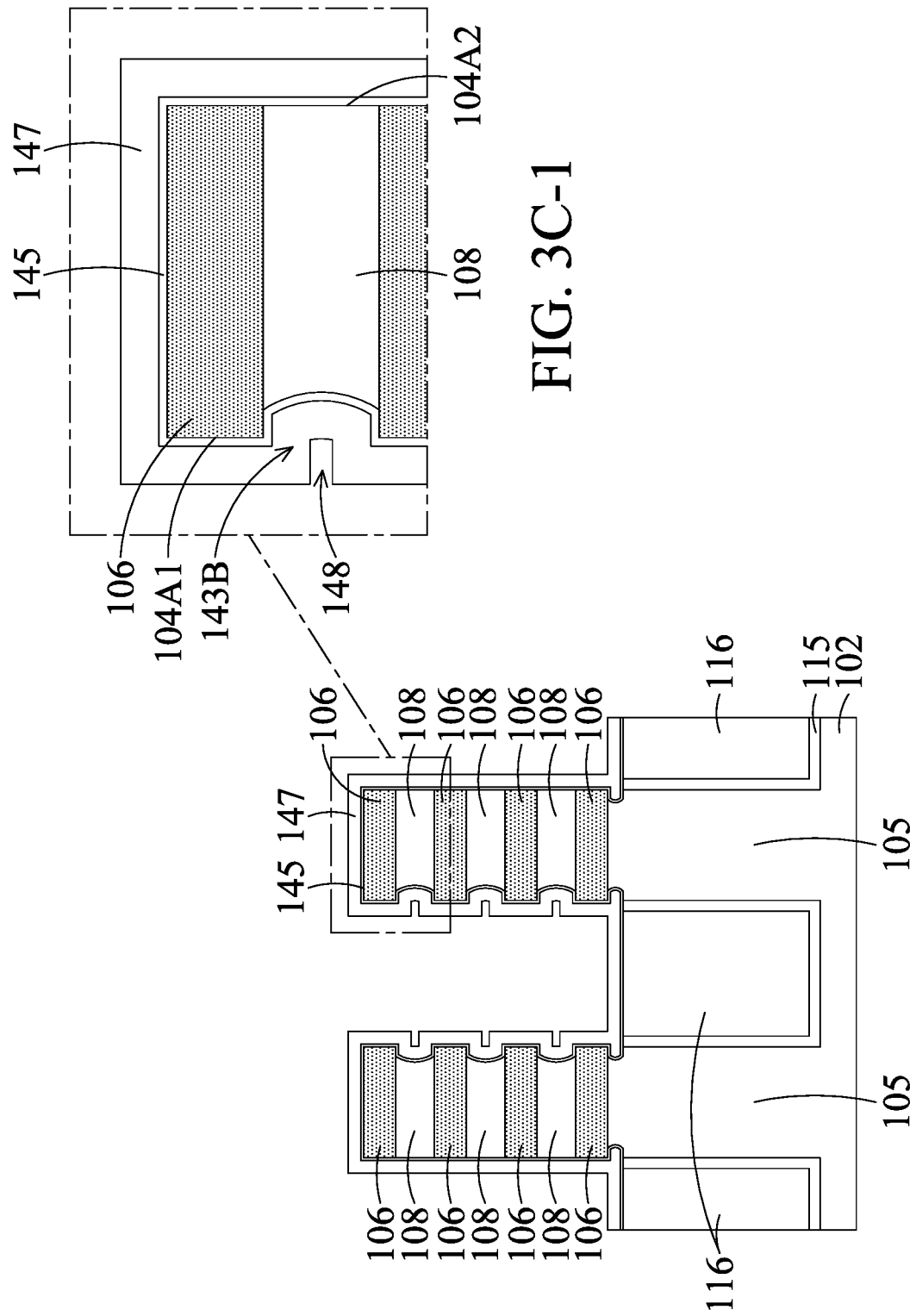

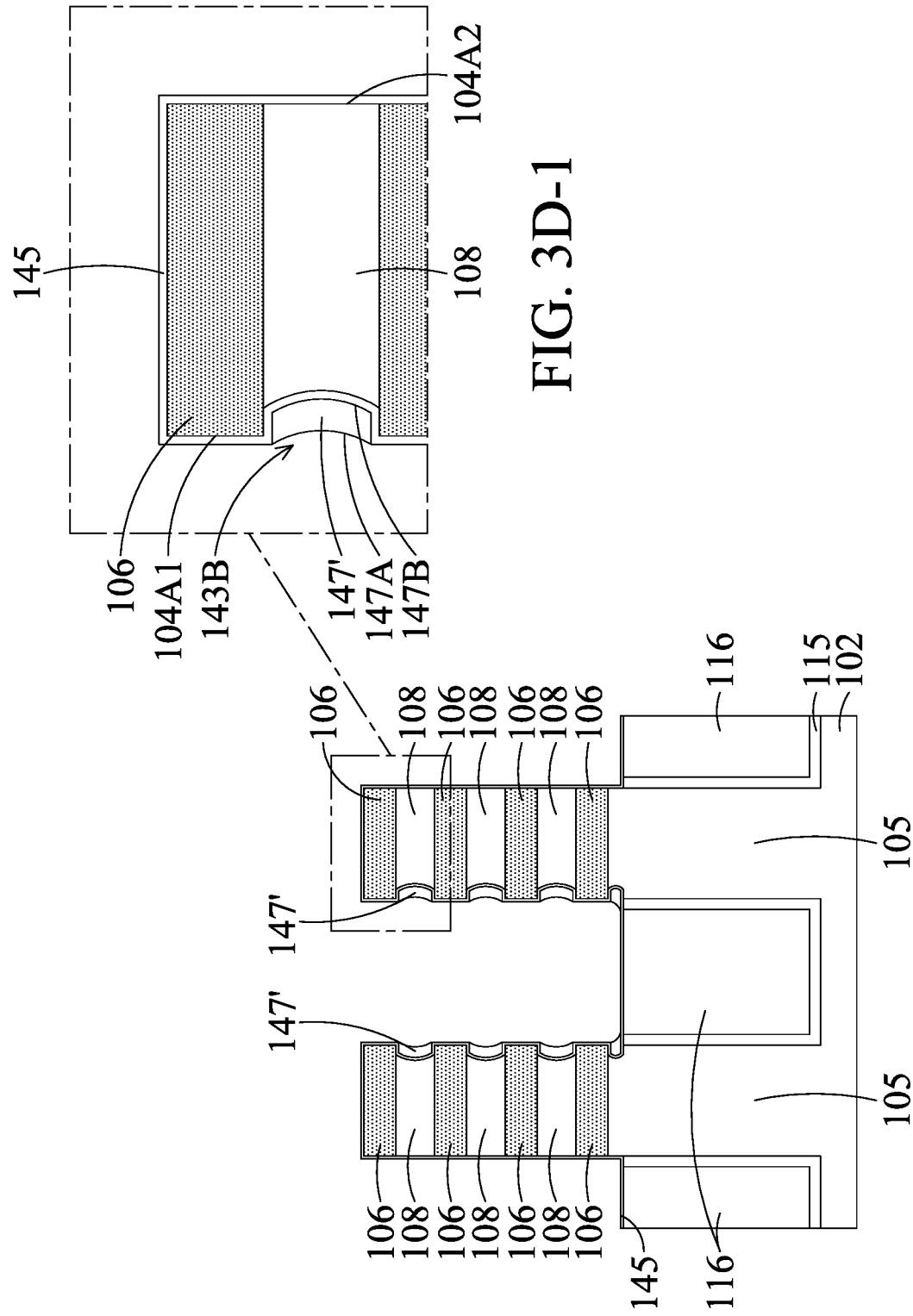

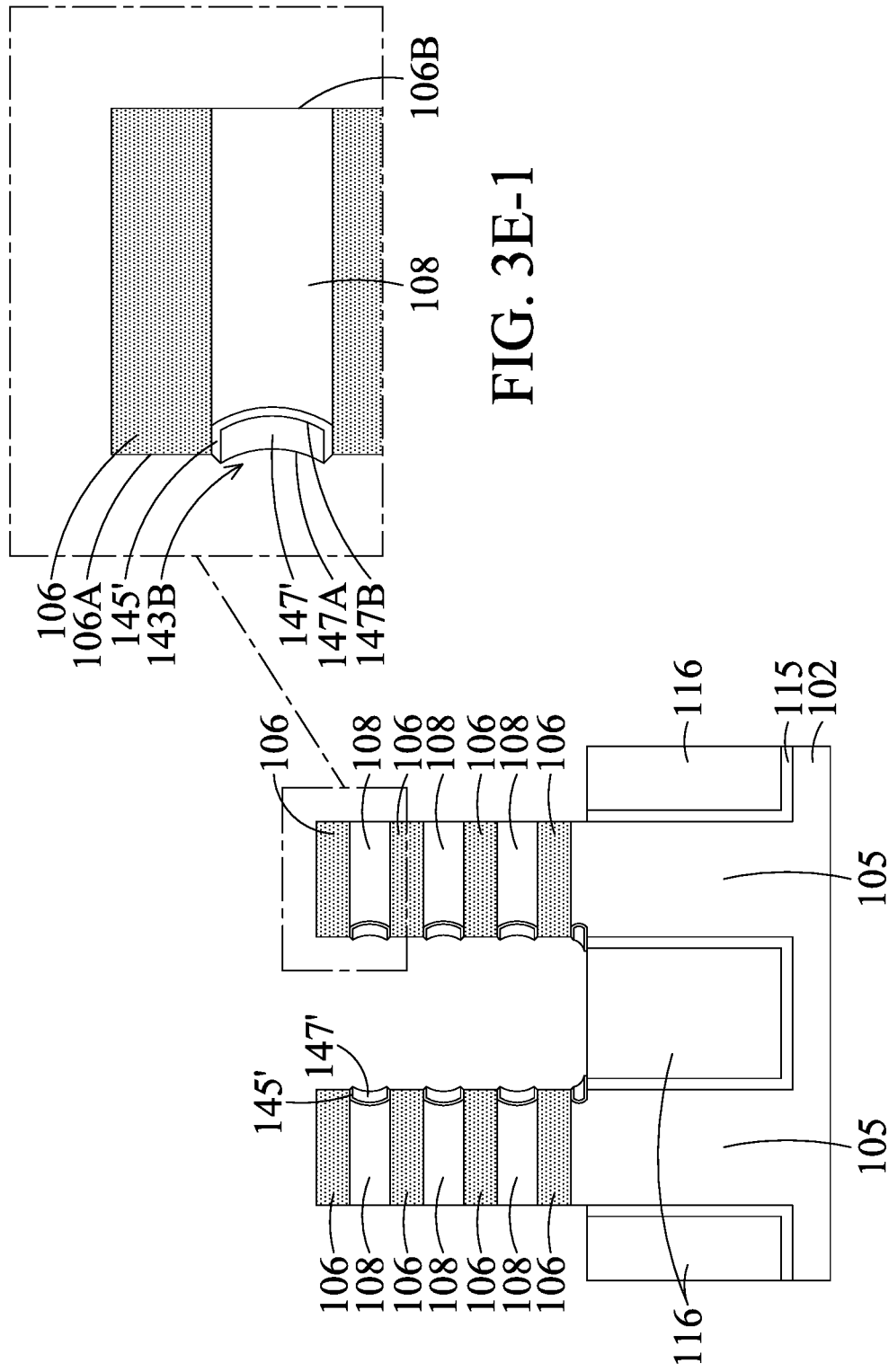

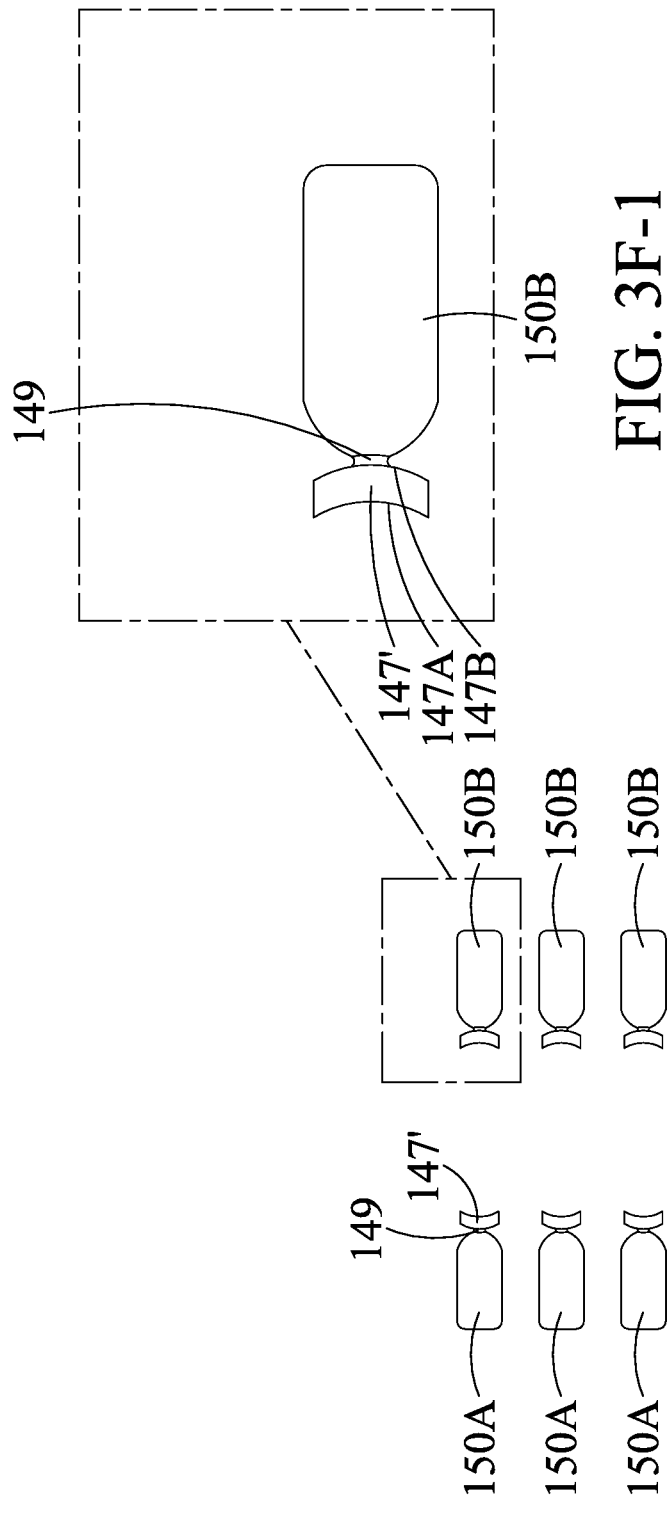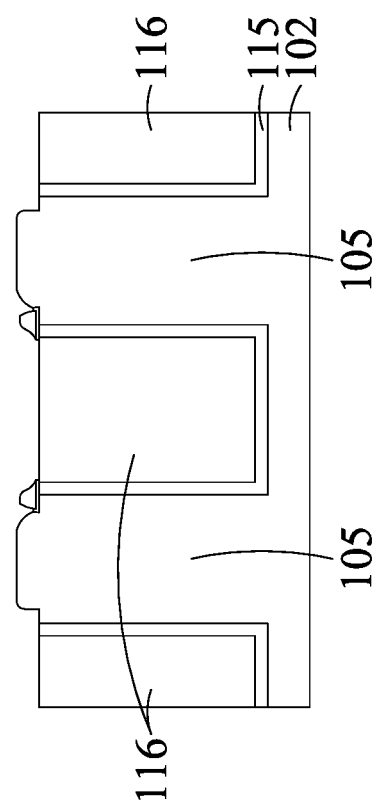
FIG. 3F-1
FIG. 3F

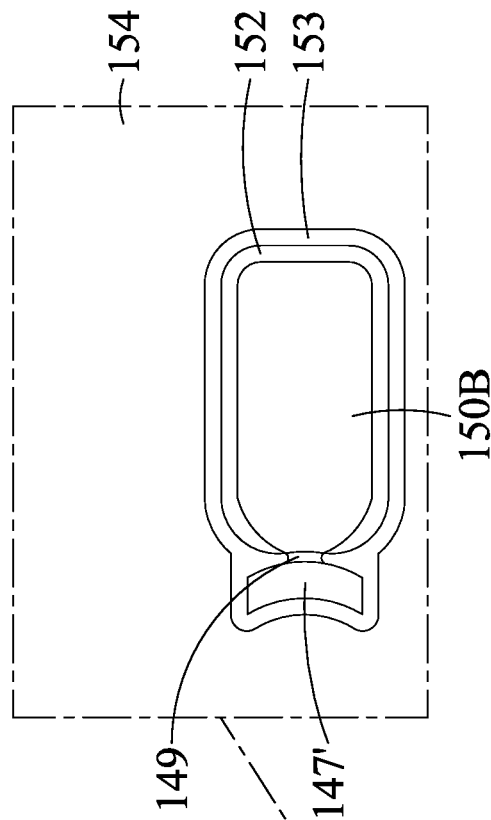
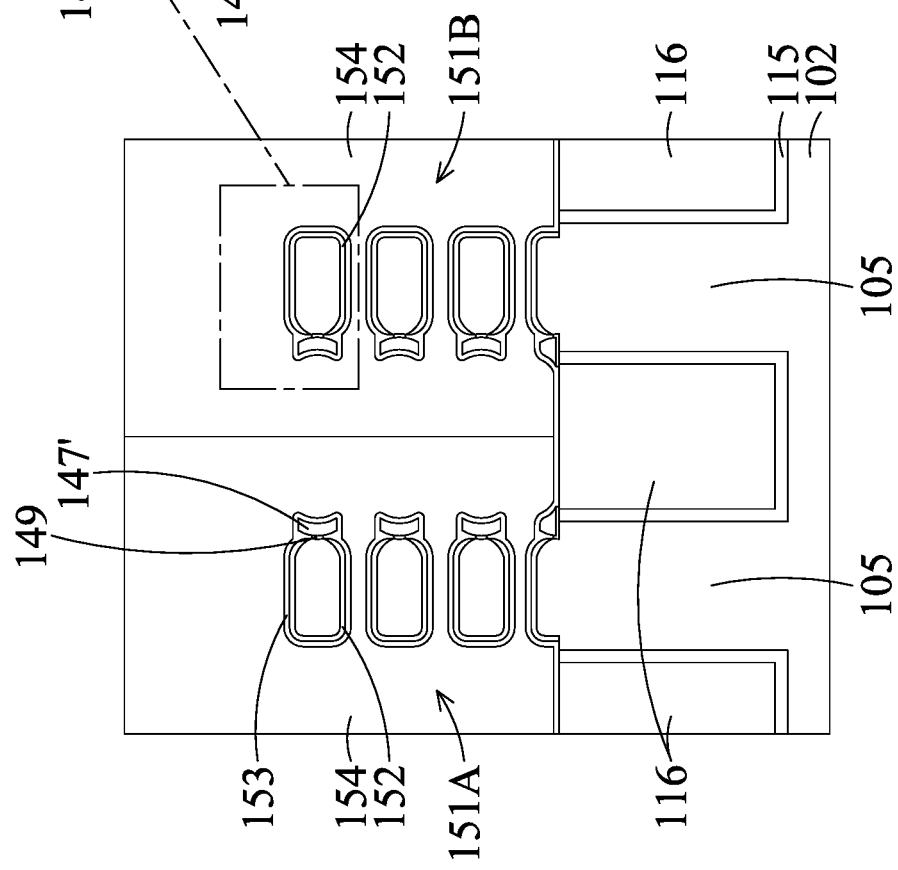
FIG. 3G-1
FIG. 3G

SEMICONDUCTOR AND METHOD FOR MANUFACTURING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1J, 1K, and 2A are perspective cross-sectional views of intermediate stages of manufacturing a semiconductor structure illustrated along the line A-A in FIG. 1I in accordance with some embodiments.

FIGS. 1K-1 and 2A-1 are cross-sectional views of intermediate stages of manufacturing a semiconductor structure respectively corresponding to the steps in FIGS. 1K and 2A illustrated along the line A-A in FIG. 1I in accordance with some embodiments.

FIGS. 2B, 2C, 2D, 2E, and 2F are cross-sectional views of intermediate stages of manufacturing a semiconductor structure illustrated along the line A-A in FIG. 1I in accordance with some embodiments.

FIGS. 2B-1, 2C-1, 2D-1, 2E-1, and 2F-1 are enlarged views of FIGS. 2B, 2C, 2D, 2E, and 2F in accordance with some embodiments, respectively.

FIG. 2H-1 is a cross-sectional view of the semiconductor structure illustrated along the line A-A in FIG. 1I, in accordance with some embodiments of the present disclosure.

FIG. 2H-2 is an enlarged view of FIG. 2H-1, in accordance with some embodiments of the present disclosure.

FIG. 2H-3 is a cross-sectional view of the semiconductor structure illustrated along the line B-B in FIG. 2H, in accordance with some embodiments of the present disclosure.

FIG. 2H-4 is a cross-sectional view of the semiconductor structure illustrated along the line C-C in FIG. 2H, in accordance with some embodiments of the present disclosure.

FIGS. 3A and 3B are perspective cross-sectional views of intermediate stages of manufacturing a semiconductor structure illustrated along the line A-A in FIG. 1I after the step shown in FIG. 1K in accordance with some embodiments.

FIGS. 3A-1, 3B-1, 3C, 3D, 3E, 3F, and 3G are cross-sectional views of intermediate stages of manufacturing a semiconductor structure illustrated along the line A-A in FIG. 1I after the step in FIG. 3B in accordance with some embodiments.

FIGS. 3C-1, 3D-1, 3E-1, 3F-1, and 3G-1 are enlarged views of FIGS. 3C, 3D-3E, 3F, and 3G in accordance with some embodiments, respectively.

FIG. 4 is an enlarged view of the nanostructure in accordance with some embodiments.

DETAILED DESCRIPTION

Figure 1A:
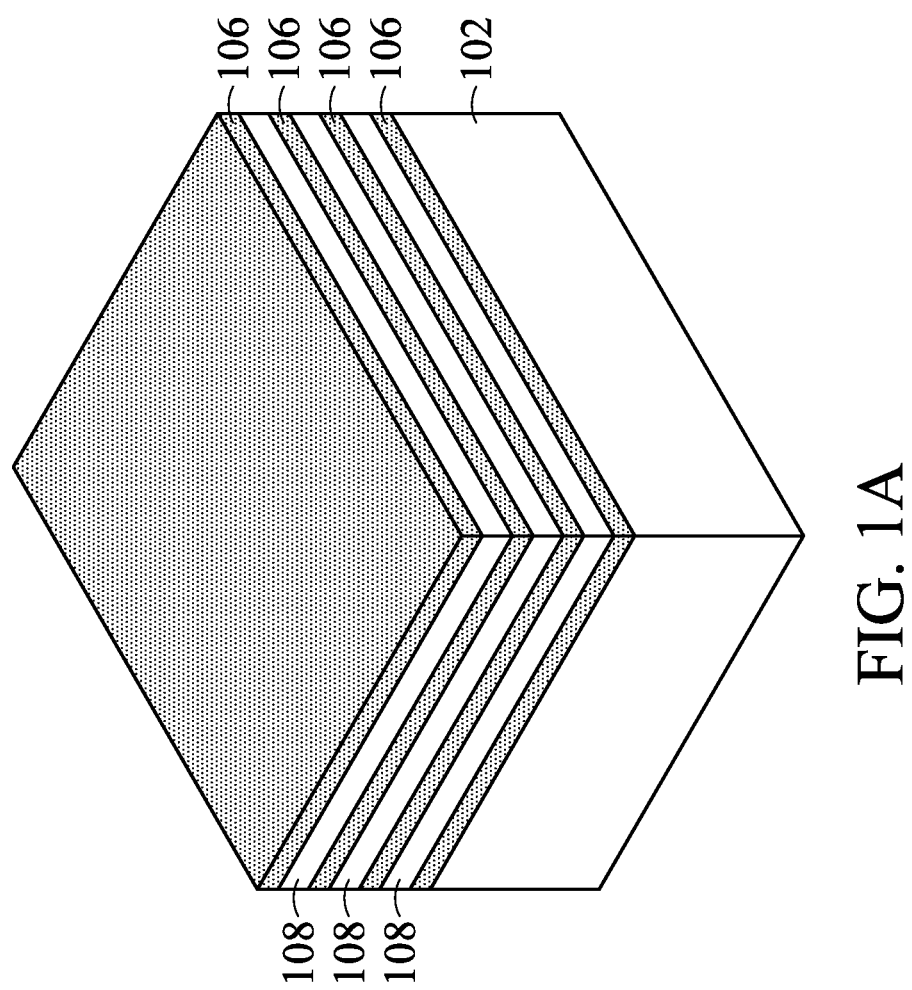
FIGS. 1A to 1I illustrate perspective views of intermediate stages of manufacturing a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numerals are used to designate like elements.

It should be understood that additional operations can be provided before, during, and after the method, and some of the operations described can be replaced or eliminated for other embodiments of the method.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or molti-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a gate structure formed over a substrate and a source/drain structure formed adjacent to the gate structure. A nanostructure may be wrapped by the gate structure, and a dielectric spacer may be formed adjacent to the nanostructure. Therefore, lower space is required between the nanostructure and the cut metal gate structure, so the critical dimension of the semiconductor structure may be reduced.

FIGS. 1A to 1I illustrate perspective views of intermediate stages of manufacturing a semiconductor structure 100 (e.g. see FIG. 2H) in accordance with some embodiments. As shown in FIG. 1A, first semiconductor material layers 106 and second semiconductor material layers 108 are formed over a substrate 102 in accordance with some embodiments.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers. In some embodiments, the first semiconductor material layer 106 is disposed on the topmost layer of the semiconductor material stack.

In some embodiments, the first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
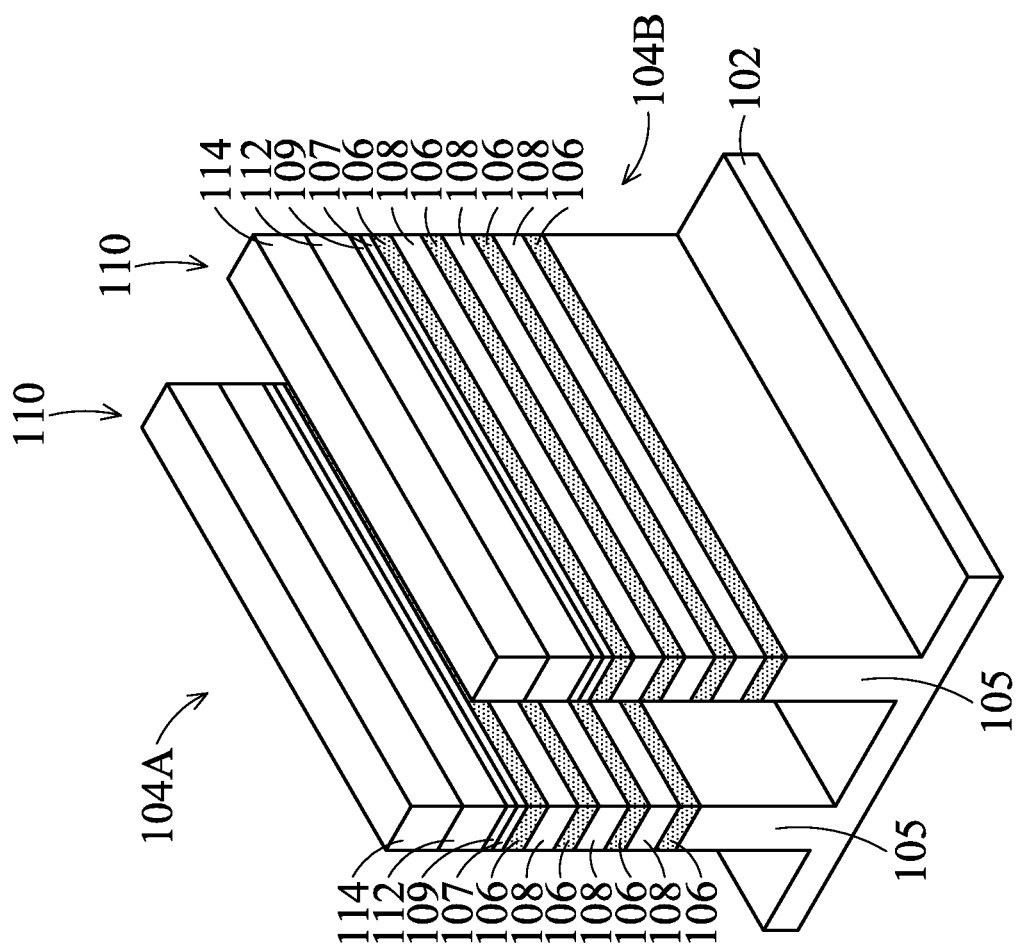

After the first semiconductor material layers 106 and the second semiconductor material layers 108 are formed as a semiconductor material stack over the substrate 102, the semiconductor material stack is patterned to form fin structures 104A and 104B, as shown in FIG. 1B in accordance with some embodiments. In some embodiments, the fin structures 104A and 104B includes a base fin structure 105 and the semiconductor material stack of the first semiconductor material layers 106 and the second semiconductor material layers 108.

In some embodiments, a third semiconductor layer 107 may be disposed over the semiconductor stack and in contact with the first semiconductor material layer 106. In some embodiments, the third semiconductor layer 107 is used for protecting the first semiconductor material layers 106 from subsequent processes, such as etching process. In some embodiments, the material of the third semiconductor layer 107 may include silicon. In some embodiments, the third semiconductor material layer 107 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

In some embodiments, the patterning process includes forming a mask structure 110 over the third semiconductor layer 107 and etching the semiconductor material stack and the underlying substrate 102 through the mask structure 110. In some embodiments, the mask structure 110 is a multilayer structure including an oxide layer 109, a nitride layer 112 formed over the oxide layer 109, and an oxide layer 114 formed over the nitride layer 112. The oxide layer 109 and the oxide layer 114 may be made of silicon oxide, which is formed by thermal oxidation or CVD, and the nitride layer 112 may be made of silicon nitride, which is formed by CVD, such as LPCVD or plasma-enhanced CVD (PECVD).

Figure 1C:
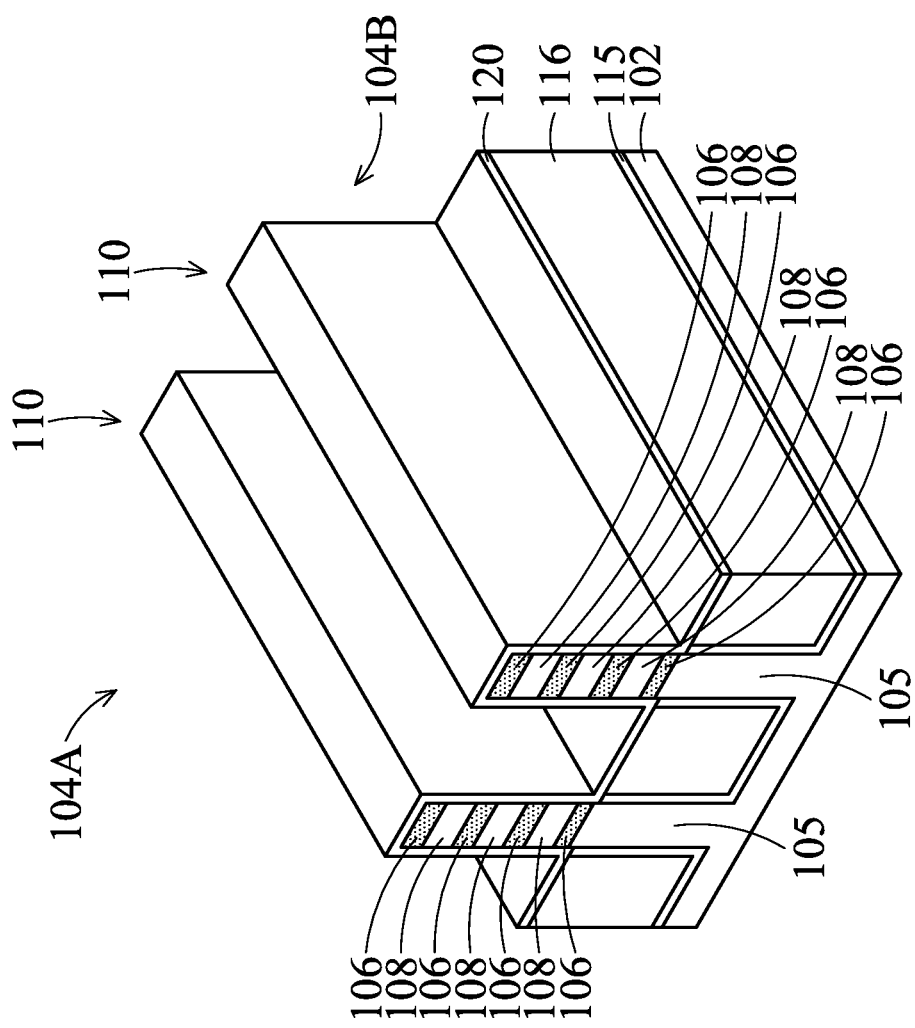

After the fin structures 104A and 104B are formed, an isolation structure 116 is formed around the fin structures 104A and 104B, and the mask structure 110 and the third semiconductor layer 107 are removed, as shown in FIG. 1C in accordance with some embodiments. The isolation structure 116 is configured to electrically isolate active regions (e.g. the fin structure 104) of the semiconductor structure 100 and is also referred to as shallow trench isolation (STI) feature in accordance with some embodiments.

In some embodiments, the isolation structure 116 may be formed by depositing an insulating layer over the substrate 102 and recessing the insulating layer so that the fin structures 104A and 104B are protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner 115 is formed before the isolation structure 116 is formed, and the dielectric liner 115 is made of silicon nitride and the isolation structure 116 formed over the dielectric liner 115 is made of silicon oxide.

In some embodiments, a dummy gate dielectric layer 120 is formed over the fin structures 104A and 104B and the isolation structure 116. In some embodiments, the dummy gate dielectric layer 120 is made of one or more dielectric materials, such as silicon oxide, silicon nitride, silicon oxynitride (SiON), HfO$_2$, HfZrO, HfSiO, HfTiO, HfAlO, or a combination thereof. In some embodiments, the dummy gate dielectric layer 120 formed using thermal oxidation, CVD, ALD, physical vapor deposition (PVD), another suitable method, or a combination thereof.

Figure 1D:
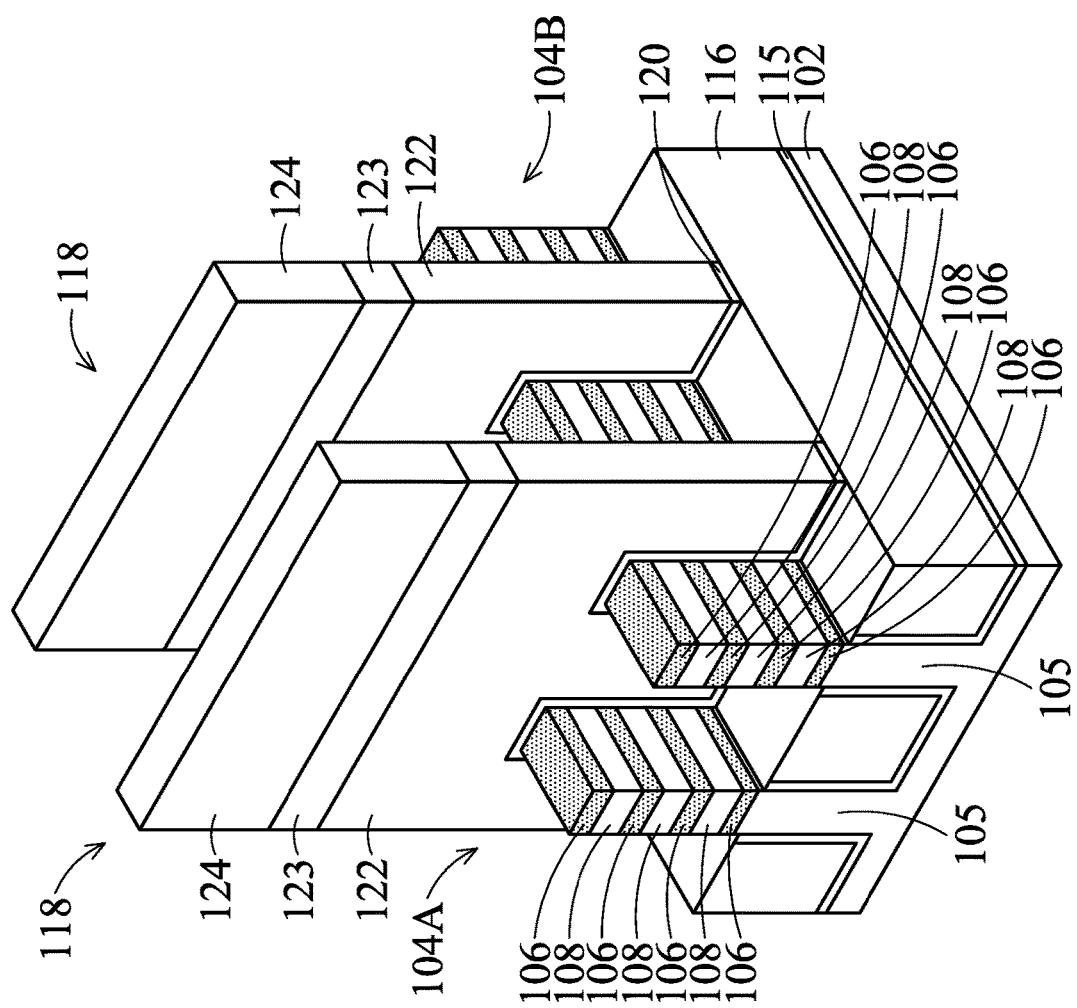

After the isolation structure 116 and the dummy gate dielectric layers 120 are formed, dummy gate structures 118 are formed across the fin structure 104 and extend over the isolation structure 116, as shown in FIG. 1D in accordance with some embodiments. The dummy gate structures 118 may be used to define the source/drain regions and the channel regions of the resulting semiconductor structure 100. In some embodiments, source/drain region(s) may refer to a source or a drain, individually or collectively dependent upon the context.

In some embodiments, the dummy gate structures 118 include dummy gate dielectric layers 120 and dummy gate electrode layers 122. In some embodiments, the dummy gate electrode layers 122 include polycrystalline-silicon (poly-Si), polycrystalline silicon-germanium (poly-SiGe), metallic nitrides, metallic silicides, metals, or a combination thereof. In some embodiments, the dummy gate electrode layers 122 are formed using CVD, PVD, or a combination thereof.

In some embodiments, a dielectric layer 123 and a dielectric layer 124 are formed over the dummy gate structures 118 to act as hard mask layers. In some embodiments, the dielectric layer 123 is silicon oxide, and the dielectric layer 124 is silicon nitride.

The formation of the dummy gate structures 118 may include conformally forming a dielectric material as the dummy gate dielectric layers 120 in accordance with some embodiments. Afterwards, a conductive material may be formed over the dielectric material as the dummy gate electrode layers 122, and the dielectric layer 123 and the dielectric layer 124 may be formed over the conductive material in accordance with some embodiments. Next, the dielectric material and the conductive material may be patterned through the dielectric layer 123 and the dielectric layer 124 to form the dummy gate structures 118 in accordance with some embodiments. In some embodiments, the excess dummy gate dielectric layers 120 may be removed using a plasma dry etching, a dry chemical etching, and/or a wet etching.

Figure 1E:
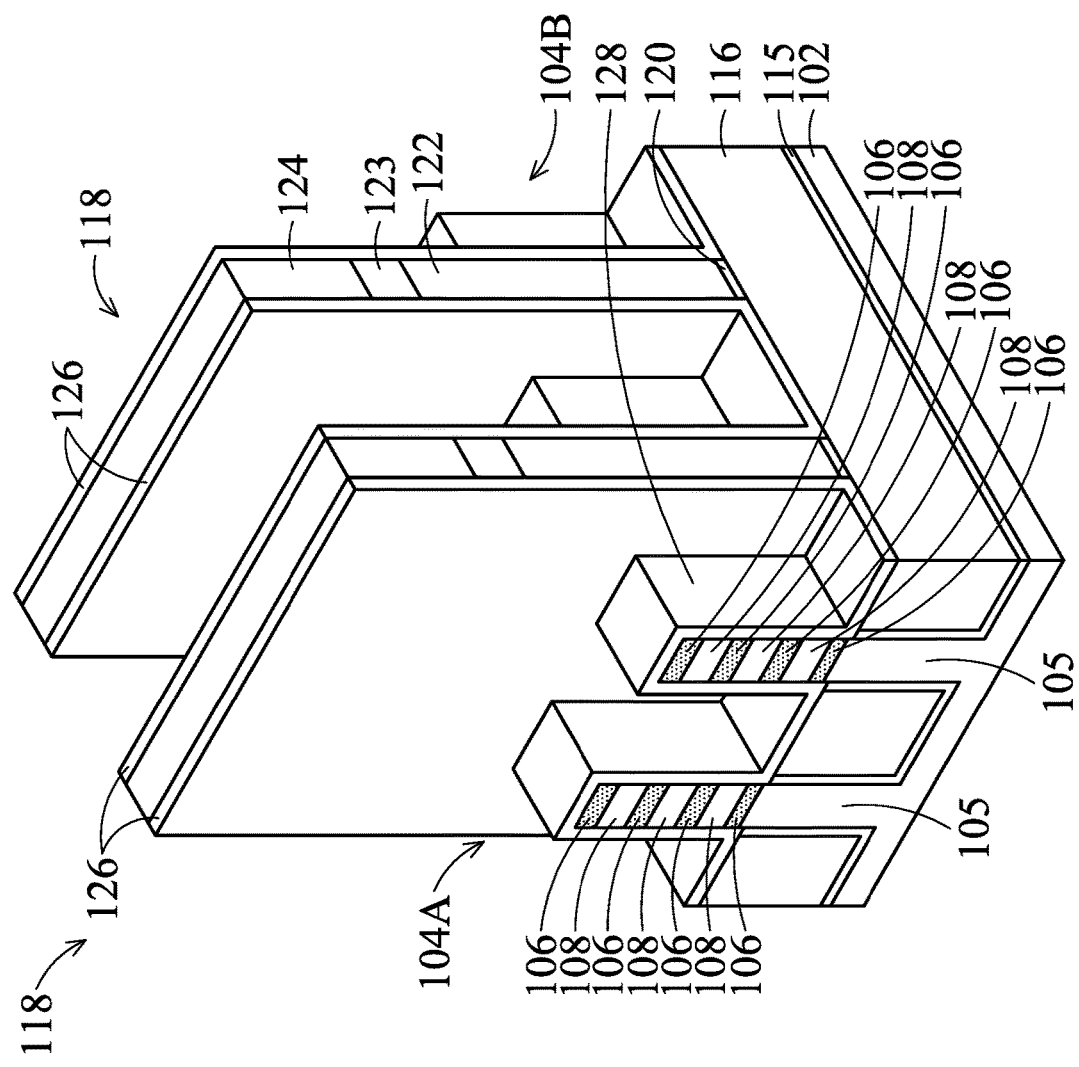

After the dummy gate structures 118 are formed, gate spacers 126 are formed along and covering opposite sidewalls of the dummy gate structure 118 and fin spacers 128 are formed along and covering opposite sidewalls of the source/drain regions of the fin structures 104A and 104B, as shown in FIG. 1E in accordance with some embodiments.

The gate spacers 126 may be configured to separate source/drain structures from the dummy gate structure 118 and support the dummy gate structure 118, and the fin spacers 128 may be configured to constrain a lateral growth of subsequently formed source/drain structure and support the fin structure 104.

In some embodiments, the gate spacers 126 and the fin spacers 128 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacers 126 and the fin spacers 128 may include conformally depositing a dielectric material covering the dummy gate structure 118, the fin structure 104, and the isolation structure 116 over the substrate 102, and performing an anisotropic etching process, such as dry plasma etching, to remove the dielectric layer covering the top surfaces of the dummy gate structure 118, the fin structures 104A and 104B, and portions of the isolation structure 116.

Figure 1F:
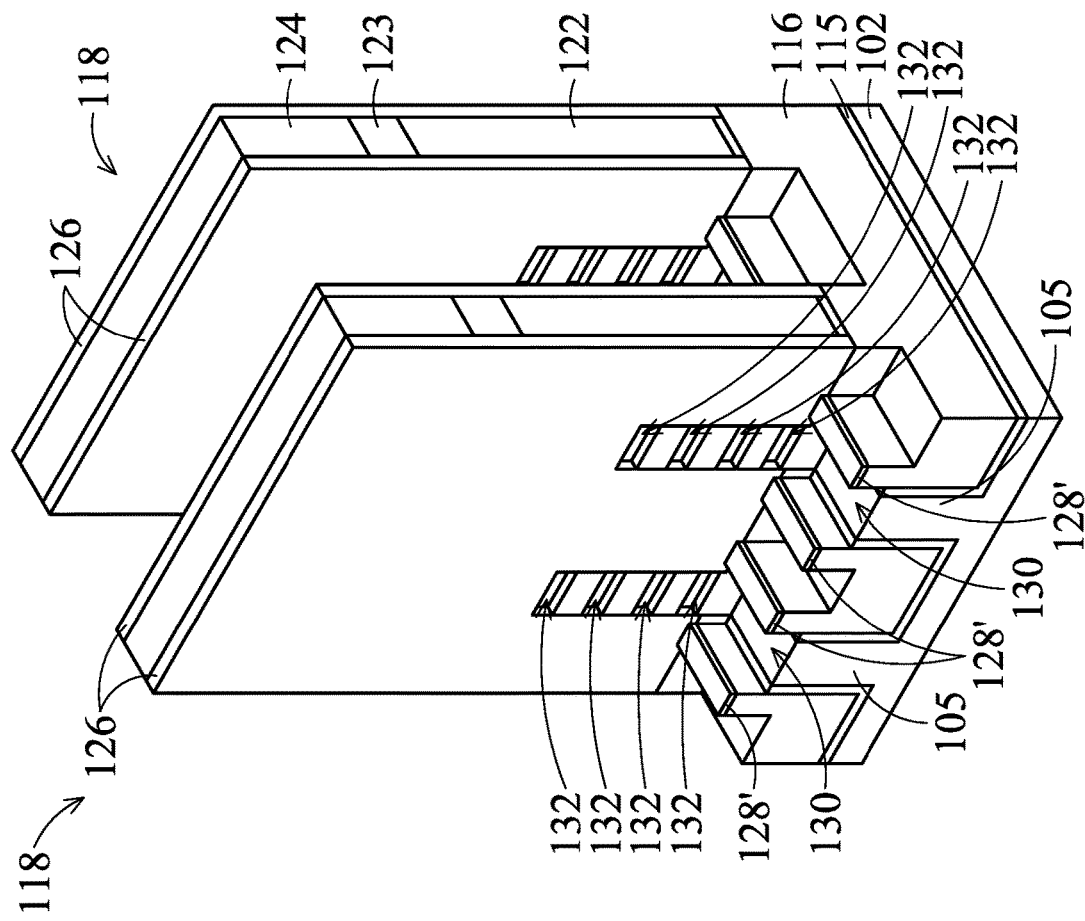

After the gate spacers 126 and the fin spacers 128 are formed, the source/drain regions of the fin structure 104 are recessed to form source/drain recesses 130, as shown in FIG. 1F in accordance with some embodiments. More specifically, the first semiconductor material layers 106 and the second semiconductor material layers 108 not covered by the dummy gate structures 118 and the gate spacers 126 are removed in accordance with some embodiments.

In some embodiments, the fin structures 104A and 104B are recessed by performing an etching process. The etching process may be an anisotropic etching process, such as dry plasma etching, and the dummy gate structure 118 and the gate spacers 126 are used as etching masks during the etching process. In some embodiments, the fin spacers 128 are also recessed to form lowered fin spacers 128'. In some embodiments, the dielectric liner 115 may be recessed together. In some embodiments, the dielectric liner 115 may not be recessed when recessing the fin structures 104A and 104B, and the lowered fin spacers 128' may be formed over the dielectric liner 115.

After the source/drain recesses 130 are formed, the first semiconductor material layers 106 exposed by the source/drain recesses 130 are laterally recessed to form notches 132.

In some embodiments, an etching process is performed on the semiconductor structure to laterally recess the first semiconductor material layers 106 of the fin structures 104A and 104B from the source/drain recesses 130 to form the notches 132. In some embodiments, during the etching process, the first semiconductor material layers 106 have a greater etching rate (or etching amount) than the second semiconductor material layers 108, thereby forming the notches 132 between adjacent second semiconductor material layers 108. In some embodiments, the etching process is an isotropic etching such as dry chemical etching, remote plasma etching, wet chemical etching, another suitable technique, and/or a combination thereof.

Figure 1G:
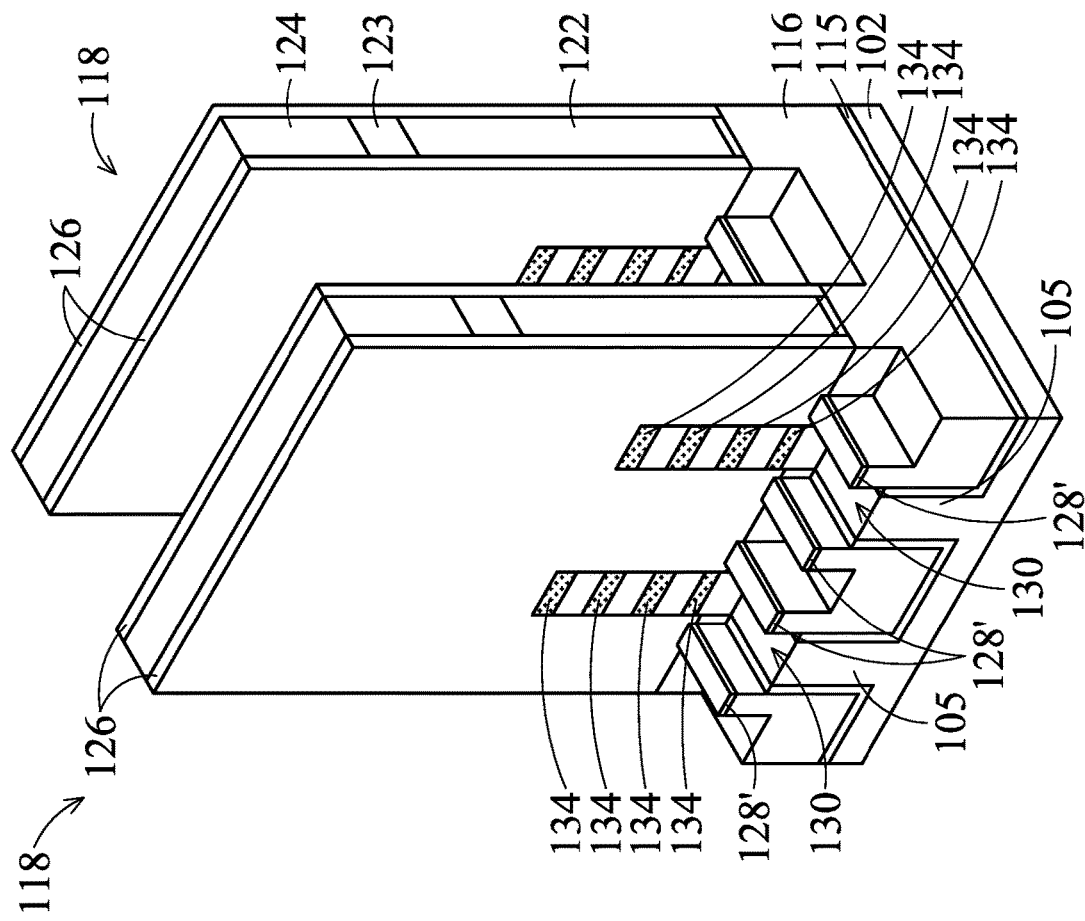

Next, inner spacers 134 are formed in the notches 132 between the second semiconductor material layers 108, as shown in FIG. 1G in accordance with some embodiments. The inner spacers 134 are configured to separate the source/drain structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

Figure 1H:
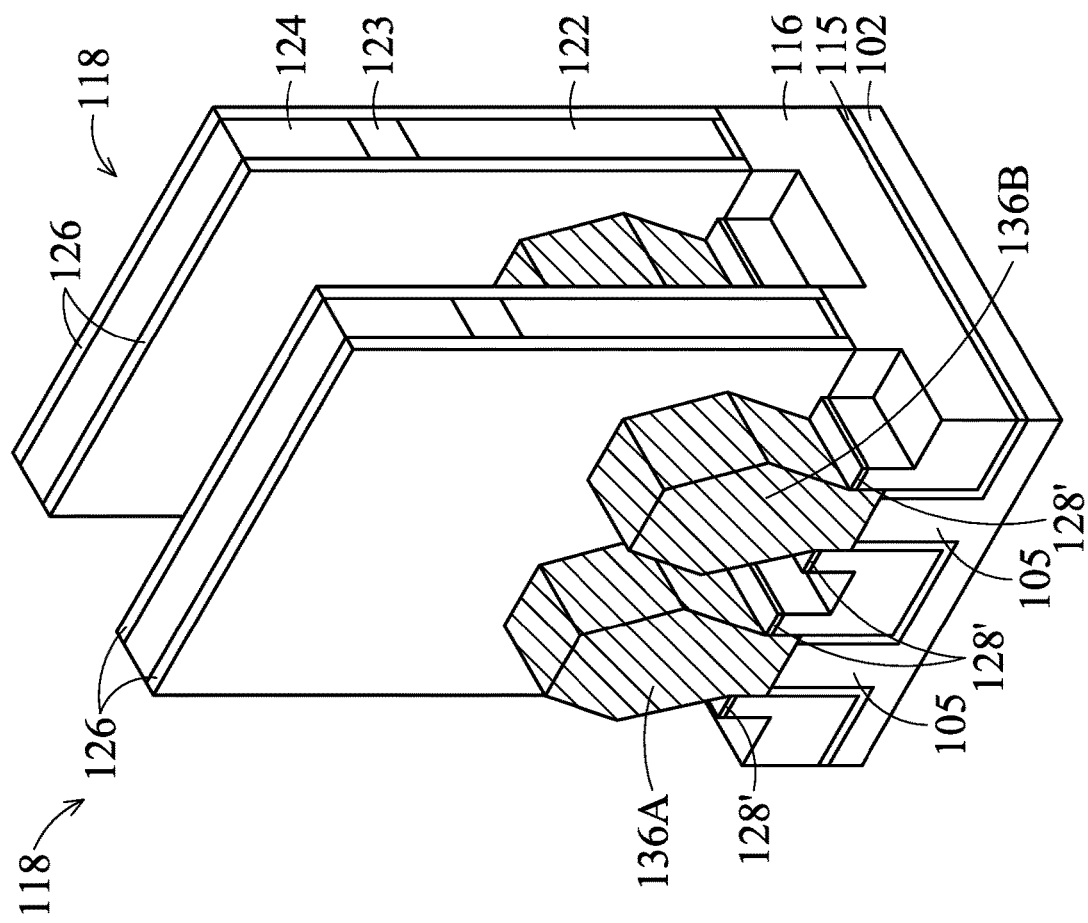

After the inner spacers 134 are formed, source/drain structures 136A and 136B are formed in the source/drain recesses 130, as shown in FIG. 1H in accordance with some embodiments. In some embodiments, the source/drain structures 136A and 136B are formed using an epitaxial growth process, such as MBE, MOCVD, VPE, other applicable epitaxial growth process, or a combination thereof. In some embodiments, the source/drain structures 136 are made of any applicable material, such as Ge, Si, GaAs, AlGaAs, SiGe, GaAsP, SiP, SiC, SiCP, or a combination thereof.

In some embodiments, the source/drain structures 136A and 136B are in-situ doped during the epitaxial growth process. For example, the source/drain structures 136A and 136B may be the epitaxially grown SiGe doped with boron (B). For example, the source/drain structures 136 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 136A and 136B are doped in one or more implantation processes after the epitaxial growth process.

Figure 1I:
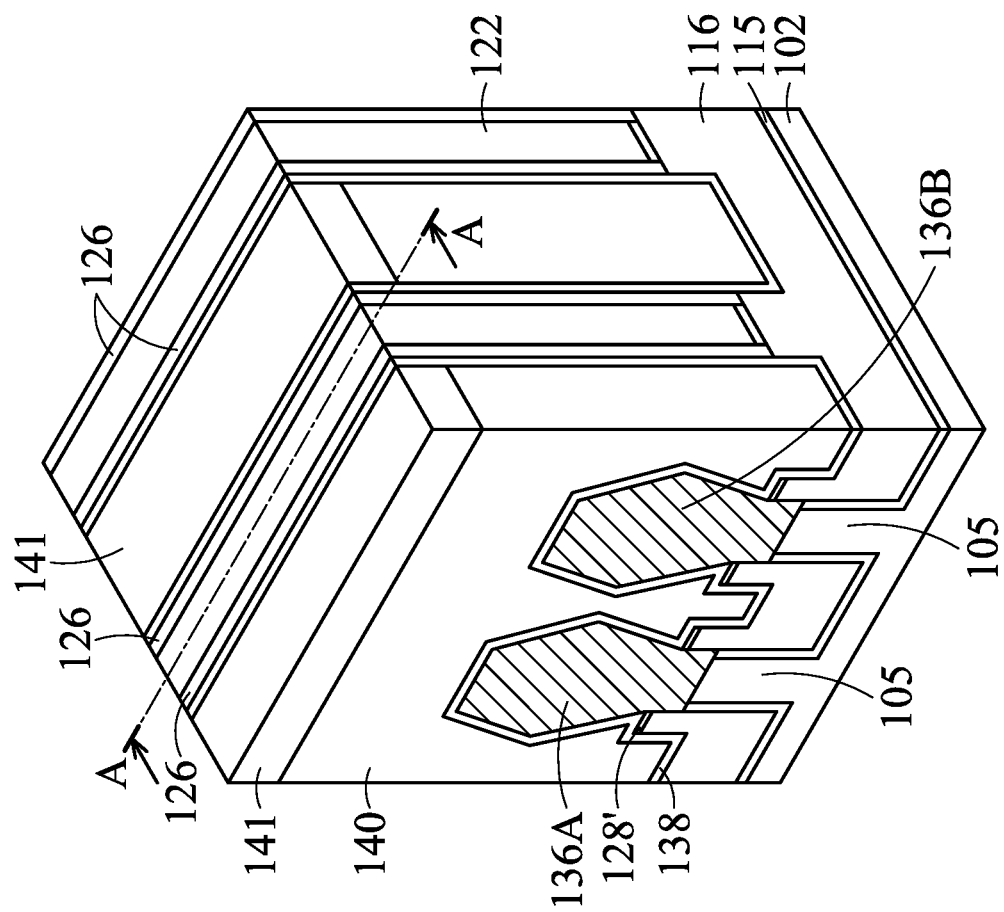

After the source/drain structures 136 are formed, a contact etch stop layer (CESL) 138 is conformally formed to cover the source/drain structures 136 and the lowered fin spacers 128', and an interlayer dielectric (ILD) layer 140 is formed over the contact etch stop layers 138, as shown in FIG. 1I in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing CVD, ALD, other application methods, or a combination thereof.

The interlayer dielectric layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 140 may be formed by chemical vapor deposition (CVD), physical vapor deposition, (PVD), atomic layer deposition (ALD), or other applicable processes.

In some embodiments, a mask layer 141 may be provided on the interlayer dielectric layer 140 to serve as a mask for subsequent processes. In some embodiments, the material of the mask layer 141 may include SiN or SiCN. In some embodiments, the mask layer 141 may be formed by chemical vapor deposition (CVD), physical vapor deposition, (PVD), atomic layer deposition (ALD), or other applicable processes.

In some embodiments, after the contact etch stop layer 138 and the interlayer dielectric layer 140 are deposited on the semiconductor structure, a planarization process such as CMP or an etch-back process may be performed to remove the dielectric layer 123 and the dielectric layer 124. Afterwards, the interlayer dielectric layer 140 is further lowered, and then the mask layer 141 is formed over the interlayer dielectric layer 140 in accordance with some embodiments.

Figure 1J:
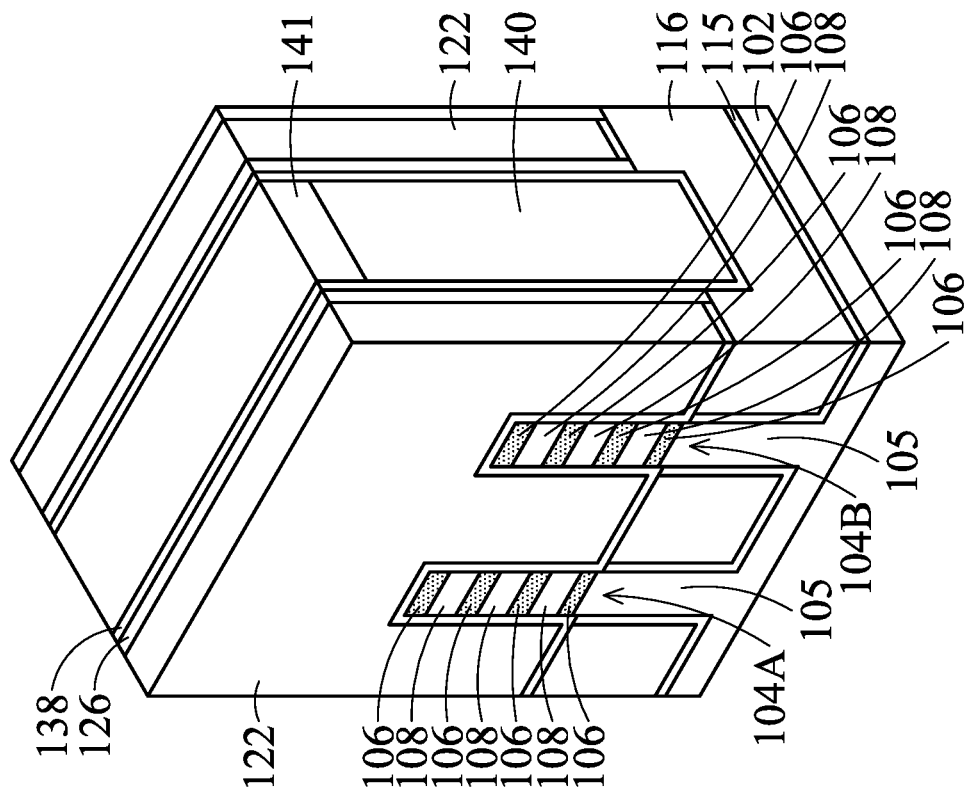
Figures 1, 1K:
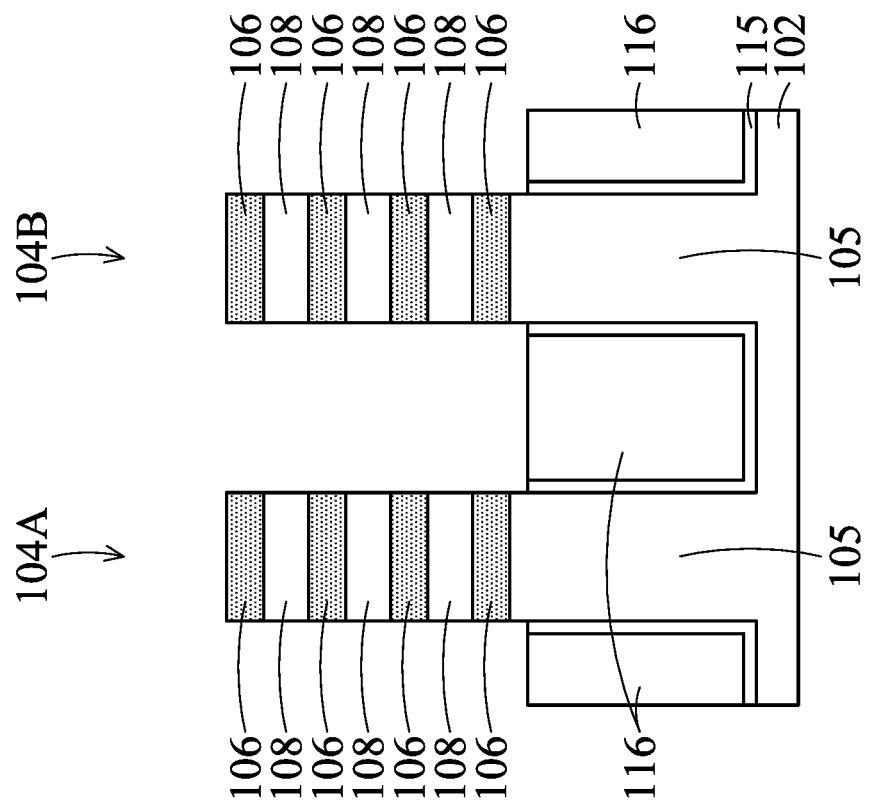
Figure 1K:
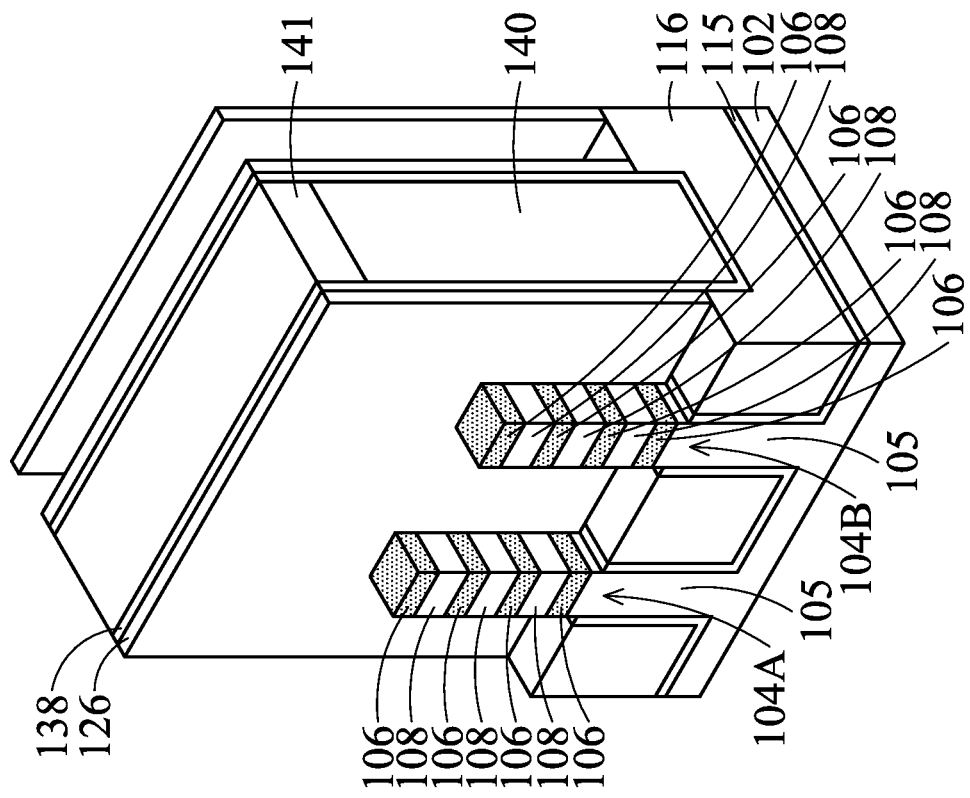
Figures 1, 2A:
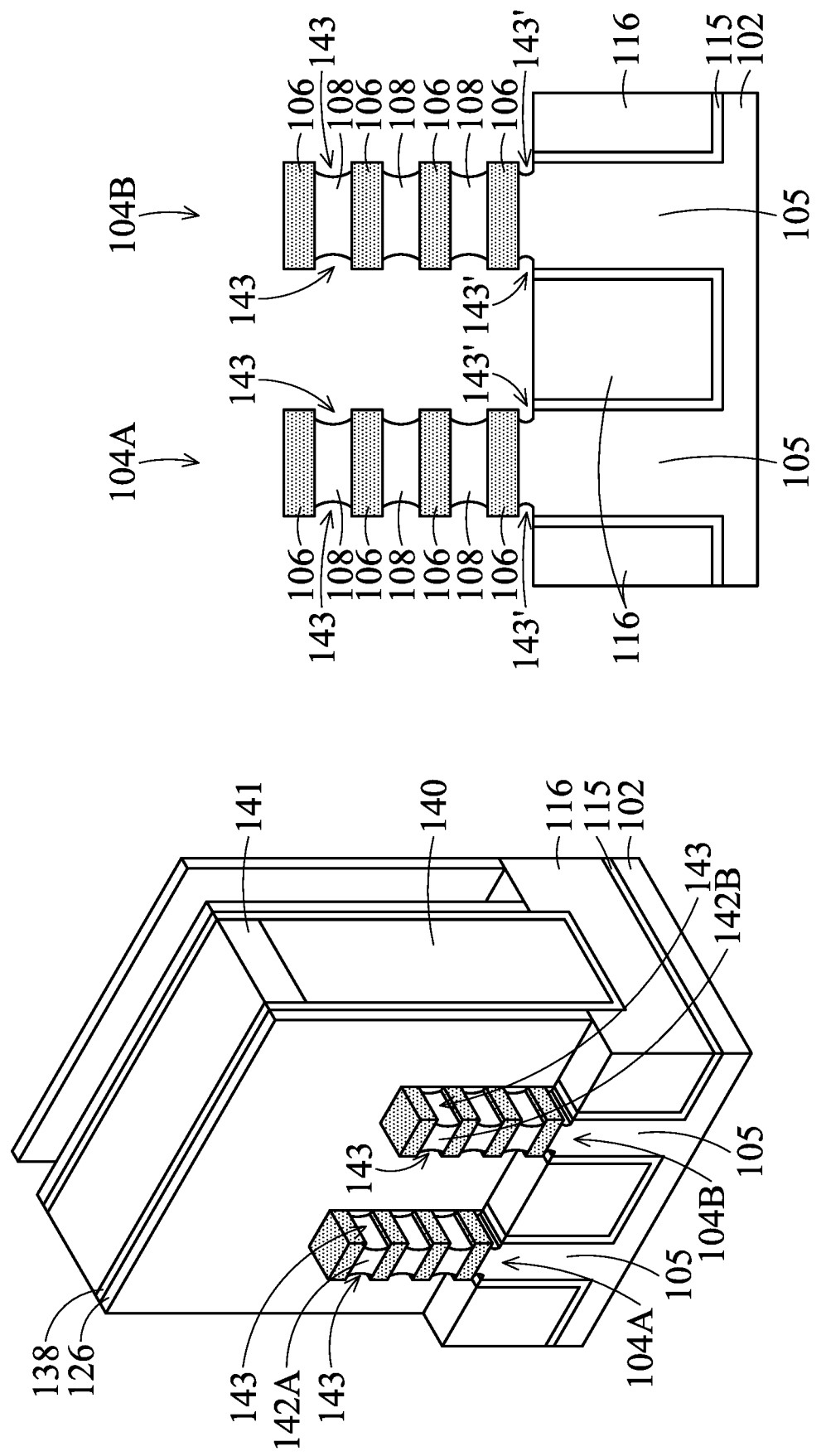

FIGS. 1J, 1K, and 2A are perspective cross-sectional views of intermediate stages of manufacturing a semiconductor structure 100 illustrated along the line A-A in FIG. 1I in accordance with some embodiments. FIGS. 1K-1 and 2A-1 are cross-sectional views of intermediate stages of manufacturing a semiconductor structure respectively corresponding to the steps in FIGS. 1K and 2A illustrated along the line A-A in FIG. 1I. As shown in FIG. 1J and FIG. 1K, the dummy gate structures 118 are removed to expose the fin structures 104A and 104B. For example, when the dummy gate electrode layers 122 are polysilicon, a wet etchant such as a tetramethylammonium hydroxide (TMAH) solution may be used to selectively remove the dummy gate electrode layers 122.

In some embodiments, as shown in FIGS. 2A and 2A-1, an etching process is performed to selectively form concave portions 143 on opposite sidewalls of the second semiconductor material layers 108. In some embodiments, the base fin structure 105 exposed from the isolation structure 116 is also recessed to form concave portions 143'. In some embodiments, the concave portions 143 and the concave portions 143' have different sizes (e.g. heights). In some embodiments, the concave portions 143 and the concave portions 143' may have a depth between about 2 nm and about 10 nm.

In some embodiments, the etching process may be any acceptable etch process, such as a reactive ion etch (RIE), neutral beam etch (NBE), the like, or a combination thereof. In some embodiments, the etching process may be anisotropic.

FIGS. 2B, 2C, 2D, 2E, and 2F are cross-sectional views of intermediate stages of manufacturing a semiconductor structure illustrated along the line A-A in FIG. 1I in accordance with some embodiments. FIGS. 2B-1, 2C-1, 2D-1, 2E-1, and 2F-1 are enlarged views of FIGS. 2B, 2C, 2D, 2E, and 2F in accordance with some embodiments, respectively.

As shown in FIGS. 2B and 2B-1, a first dielectric layer 145 is conformally formed on the fin structures 104A and 104B and the isolation structure 116 to surround the fin structures 104A and 104B, and in the concave portions 143 and 143', in accordance with some embodiments. Afterwards, a second dielectric layer 147 is conformally formed on the first dielectric layer 145 to surround the first dielectric layer 145, in accordance with some embodiments. In some embodiments, the second dielectric layer 147 does not fully fill the concave portions 143, but gaps 148 may be formed on the second dielectric layer 147 and corresponding to the concave portions 143, such as arranged with the concave portions 143 in a first direction. In some embodiments, the second dielectric layer 147 fully fills the concave portions 143. In some embodiments, the first dielectric layer 145 or the second dielectric layer 147 may be selectively omitted, depending on design requirement. In some embodiments, the materials of the first dielectric layer 145 and the second dielectric layer 147 may include dielectric materials, such as material with dielectric constant greater than 7. In some embodiments, the materials of the first dielectric layer 145 and the second dielectric layer 147 may include $SiO_2$, SiN, SiCN, SiOC, SiOCN, or other applicable materials. In some embodiments, the first dielectric layer 145 and the second dielectric layer 147 may include different materials.

In some embodiments, the formation methods of the first dielectric layer 145 and the second dielectric layer 147 may include Molecular-Beam Deposition (MBD), Atomic Layer Deposition (ALD), Chemical vapor deposition (CVD), and the like.

Next, as shown in FIG. 2C and FIG. 2C-1, the second dielectric layer 147 outside the concave portions 143 is removed to form second spacer elements 147' in the concave portions 143 in accordance with some embodiments. In some embodiments, each of the second spacer elements 147' has curved surfaces 147A and 147B. In some embodiments, the curved surface 147A faces away from the second semiconductor material layers 108, and the curved surface 147B faces the second semiconductor material layers 108 and in contact with the first dielectric layer 145. During the removal of the second dielectric layer 147, the first dielectric layer 145 is not removed, in accordance with some embodiments.

In some embodiments, the removal process of the second dielectric layer 147 may include any acceptable etch process, such as a reactive ion etch (RIE), neutral beam etch (NBE), the like, or a combination thereof. In some embodiments, the etching process may be anisotropic.

In some embodiments, the first dielectric layer 145 outside the concave portions 143 and 143' are removed, and the remaining first dielectric layer 145 becomes first dielectric layer 145' in the concave portions 143 and 143' and between the second spacer elements 147' and the second semiconductor material layers 108, as shown in FIGS. 2D and 2D-1. In some embodiments, each of the first semiconductor material layers 106 has sidewalls 106A and 106B, and the first dielectric layer 145' and the second spacer elements 147' may partially protrude from the sidewalls 106A and 106B.

In some embodiments, the removal process of the first dielectric layer 145 may include any acceptable etch process, such as a reactive ion etch (RIE), neutral beam etch (NBE), the like, or a combination thereof. In some embodiments, the etching process may be anisotropic.

Next, as shown in FIGS. 2E and 2E-1, the first semiconductor material layers 106, a portion of the second semiconductor material layers 108, and a portion of the first dielectric layer 145' are removed to form nanostructures 150A and 150B (or may be collectively referred to as nanostructures 150) with the second semiconductor material layers 108 in accordance with some embodiments.

In some embodiments the nanostructures 150A and 150B are laterally aligned with each other in the first direction. In some embodiments, gaps are formed between the nanostructures 150A and 150B. In some embodiments, the nanostructures 150A and 150B extend in a second direction. The second direction is different from the first direction. In some embodiments, a portion of the first dielectric layer 145' is removed to form first spacer elements 149 attached on sidewalls of the nanostructures 150A and 150B. In some embodiments, the first spacer element 149 and the second spacer element 147' may be collectively called as a dielectric spacer, and the first spacer element 149 is between the nanostructure 150A or 150B and the second spacer element 147' in a first direction which the gate structure 151A or 151B extends. In some embodiments, the entire first dielectric layer 145' is removed. In some embodiments, the height of the first dielectric layer 145' is greater than the height of the second spacer element 147' before the removal, and the height of the first spacer element 149 is less than the height of the second spacer element 147' after the removal.

In some embodiments, the removal process may include one or more etching processes. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Figure 2G:
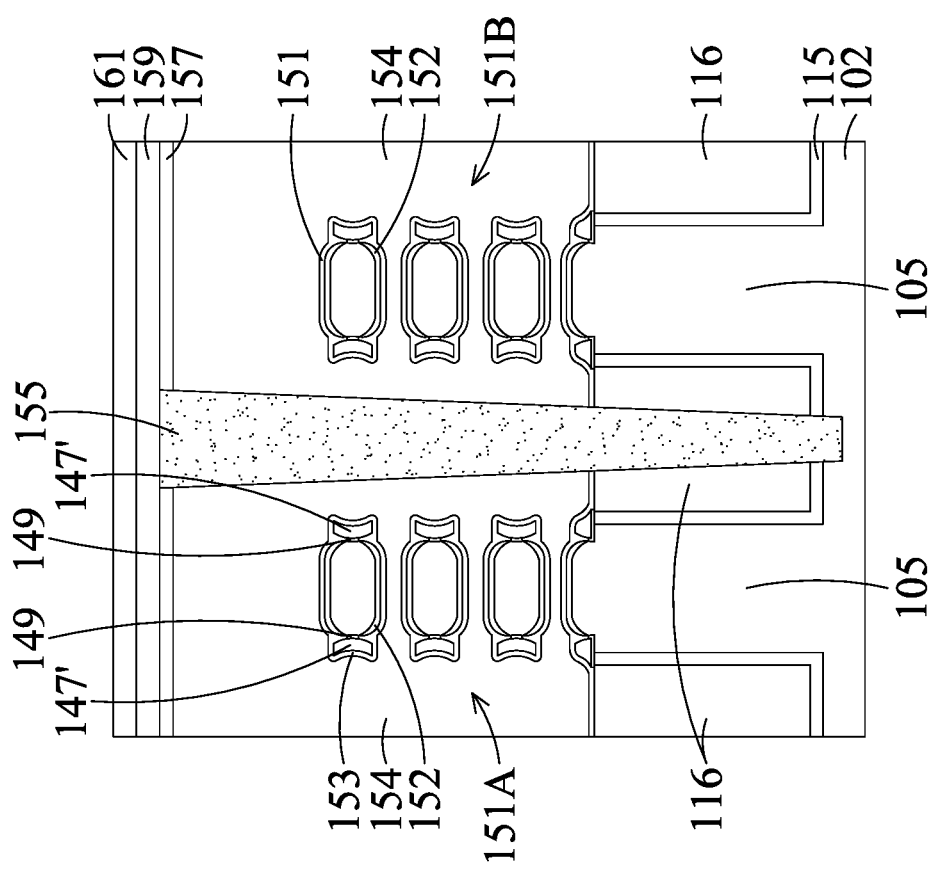
FIG. 2G is a cross-sectional view of intermediate stages of manufacturing a semiconductor structure illustrated along the line A-A in FIG. 1I in accordance with some embodiments.
Figure 2H:
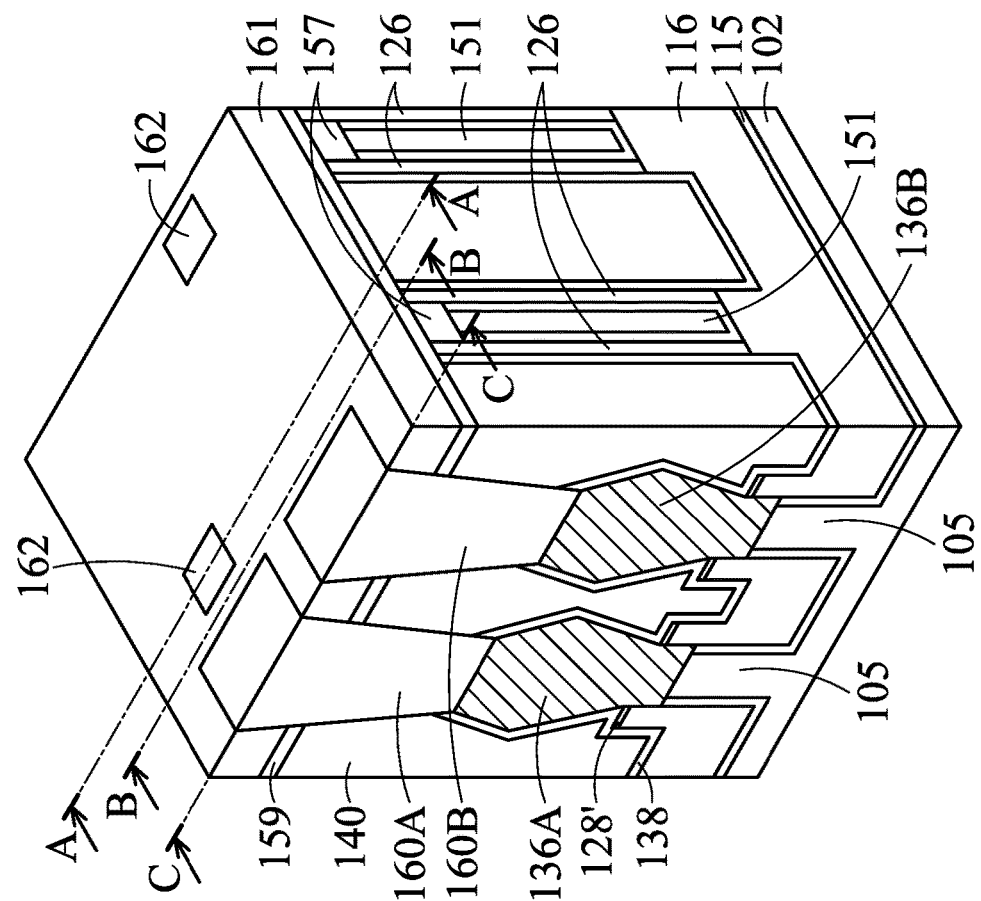
FIG. 2H is a perspective view of a semiconductor structure, in accordance with some embodiments of the present disclosure.
Figures 1, 2H:
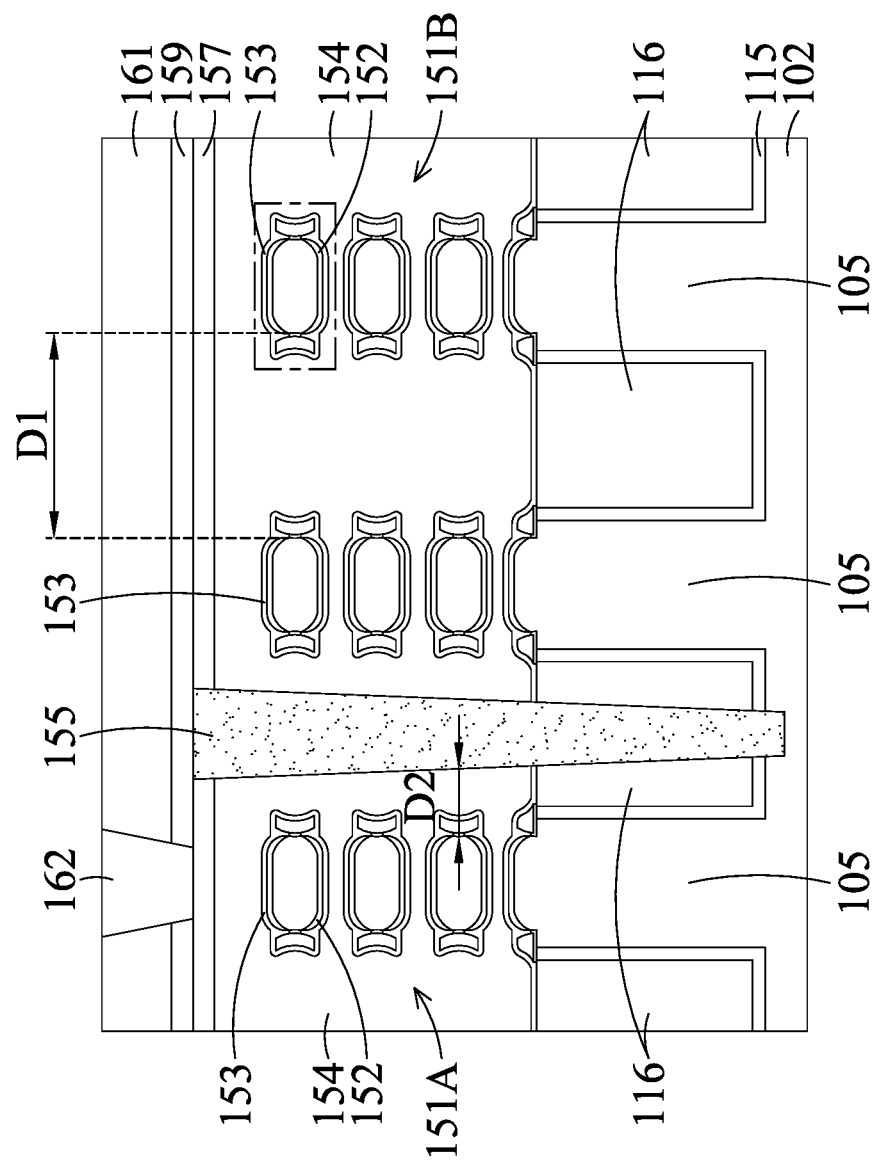
Figures 2, 2H:
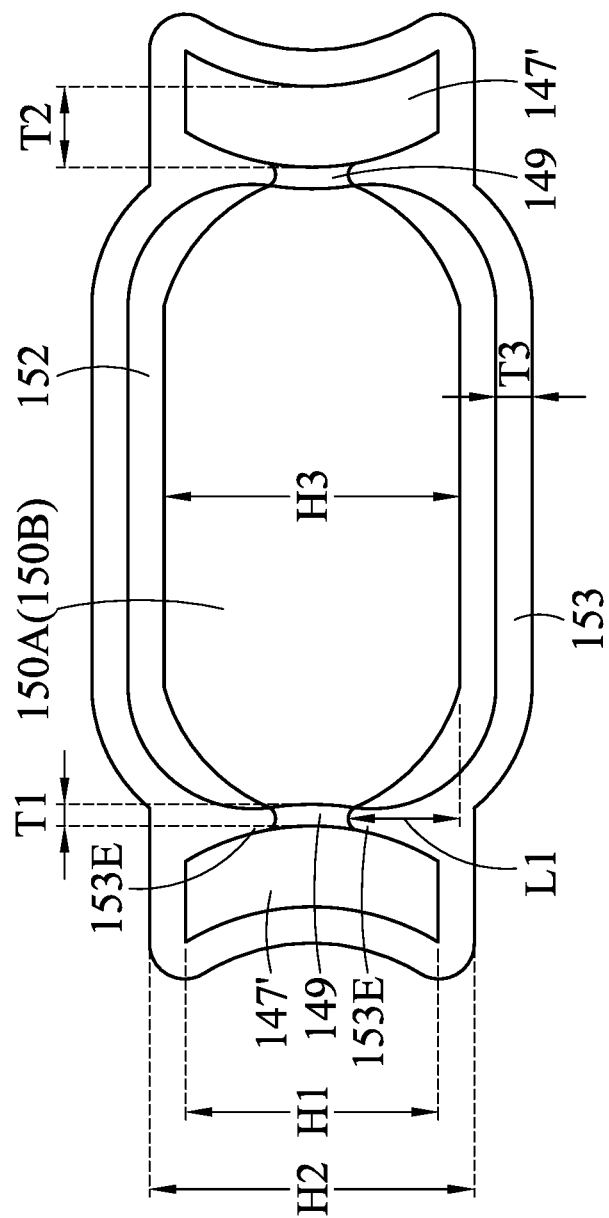
Figures 2, 2H, 3:
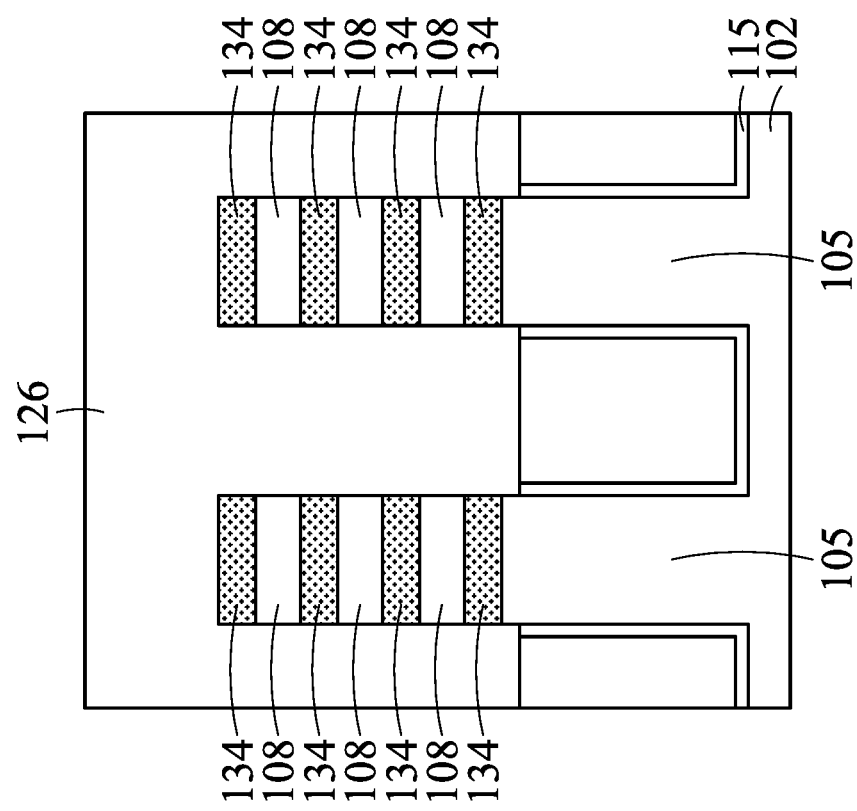

After the nanostructures 150A and 150B are formed, gate structures 151A and 151B are formed to respectively wrap around the nanostructures 150A and 150B, as shown in FIGS. 2F-1 and 2F-2 in accordance with some embodiments. The gate structures 151A and 151B respectively wrap around the nanostructures 150A and 150B (e.g. formed in the gaps between the nanostructures 150A and 150B) to form gate-all-around transistor structures in accordance with some embodiments. In some embodiments, each of the gate structures 151A and 151B includes an interfacial layer 152, a gate dielectric layer 153, and a gate electrode layer 154.

In some embodiments, the interfacial layers 152 are oxide layers formed around the nanostructures 150A and 150B and on the top of the base fin structure 105. In some embodiments, the interfacial layers 152 are formed by performing a thermal process.

In some embodiments, the gate dielectric layers 153 are formed over the interfacial layers 152, so that the nanostructures 150A and 150B are surrounded (e.g. wrapped) by the gate dielectric layers 153. In some embodiments, the nanostructures 150A and 150B and the gate dielectric layers 153 are separated by the first spacer element 149 and the interfacial layers 152. In some embodiments, the gate dielectric layers 153 and the first spacer element 149 are separated by the interfacial layer 152.

In some embodiments, the gate dielectric layers 153 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 153 are formed using CVD, ALD, another applicable method, or a combination thereof.

In some embodiments, the gate electrode layers 154 are formed on the gate dielectric layer 153. In some embodiments, the gate electrode layer 154 of the gate structures 151A and 151B may be formed concurrently or formed in separate processes, and may include identical or different materials. In some embodiments, the gate electrode layers 154 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof.

In some embodiments, the gate electrode layers 154 are formed using CVD, ALD, electroplating, another applicable method, or a combination thereof. Other conductive layers, such as work function metal layers, may also be formed in the gate structures 151A and 151B, although they are not shown in the figures.

FIG. 2G is a cross-sectional view of intermediate stages of manufacturing a semiconductor structure illustrated along the line A-A in FIG. 1I in accordance with some embodiments. In some embodiments, a conductive layer 157 is formed over the gate structures 151A and 151B, and then an isolation structure 155 is formed penetrating the conductive layer 157 and between the gate structures 151A and 151B to divide (e.g., cut or separate) the gate structures 151A and 151B into sub-metal gate structures 151A and 151B, as shown in FIG. 2G. For example, an opening is formed between the gate structures 151A and 151B, and then dielectric material is filled into the opening to form the isolation structure 155. In some embodiments, the isolation structure 155 includes $SiO_2$, SiON, SiN, SiC, SiOC, SiOCN, or low-k materials as needed.

In some embodiments, a dielectric layer 159 and a dielectric layer 161 are formed over the conductive layer 157. In some embodiments, the dielectric layer 159 and the dielectric layer 161 may be formed by suitable deposition processes, such as CVD, ALD, physical vapor deposition (PVD), another suitable method, or a combination thereof.

Since the dielectric spacers (including the first spacer element 149 and the second spacer element 147') are provided on sidewalls of the nanostructures 150A and 150B, less space is needed between the isolation structure 155 and the fin structures 104A and 104B, and the device density may be therefore increased, in accordance with some embodiments of the present disclosure. As a result, the capacitance of the semiconductor structure may be reduced, and the power efficiency may be increased, in accordance with some embodiments of the present disclosure.

Figures 2, 2H, 3, 4:
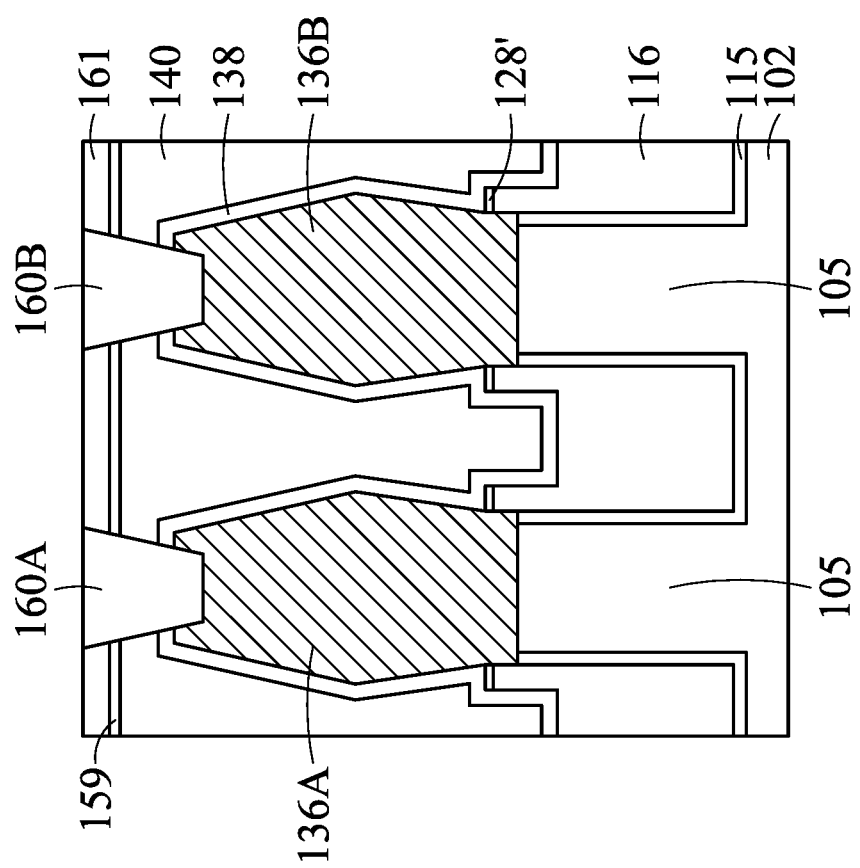
Figure 2I:
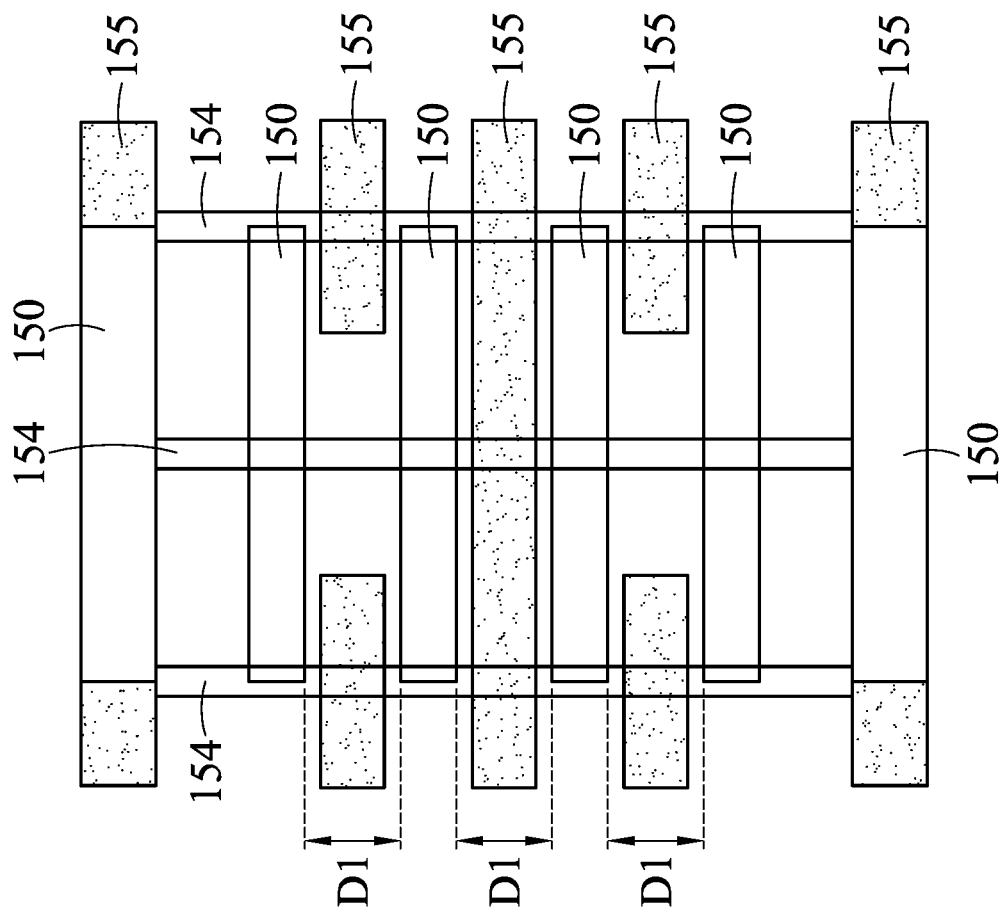
FIG. 2I is a top view of the semiconductor structure, in accordance with some embodiments of the present disclosure.

FIG. 2H is a perspective view of a semiconductor structure 100, FIG. 2H-1 is a cross-sectional view of the semiconductor structure illustrated along the line A-A in FIG. 2H, FIG. 2H-2 is an enlarged view of FIG. 2H-1, FIG. 2H-3 is a cross-sectional view of the semiconductor structure illustrated along the line B-B in FIG. 2H, FIG. 2H-4 is a cross-sectional view of the semiconductor structure illustrated along the line C-C in FIG. 2H, and FIG. 2I is a top view of the semiconductor structure, in accordance with some embodiments of the present disclosure.

In some embodiments, as shown in FIGS. 2H, 2H-1, and 2H-4, contacts 160A and 160B are formed over the source/drain structures 136A and 136B, and vias 162 are formed over the gate structure 151A. In some embodiments, the contacts 160A and 160B and vias 162 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantulum carbide (TaC), tantulum silicide nitride (TaSiN), tantalum carbide nitride (TaCN), titanium aluminide (TiAl), titanium aluminum nitride (TiAlN), other applicable conductive materials, or a combination thereof. In some embodiments, the contacts 160A and 160B and vias 162 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

In some embodiments, as shown in FIG. 2H-1, an additional gate structure is further shown, and the distance D1 between the nanostructures 150A and 150B is between about 30 nm and about 46 nm. In some embodiments, the distance D2 between the nanostructures 150A and 150B and the isolation structure 155 is less than about 7 nm. Therefore, space between the gate structures 151A and 151B and the space between the gate structure 151A and 151B and the isolation structure 155 may be reduced to enhance the performance of the semiconductor structure 100.

In some embodiments, as shown in FIG. 2H-2, the height H1 of the first spacer element 149 in a third direction is between about 0.5 nm and about 2 nm. In some embodiments, the height H2 of the second spacer element 147' in the third direction is between about 3 nm and about 8 nm. In some embodiments, the third direction is different from the first direction and the second direction. In some embodiments, the height H3 of the nanostructures 150A or 150B is between about 3 nm and about 8 nm. In some embodiments, the height H2 is less than the heights H1 and H3. In some embodiments, the gate dielectric layer 153 includes extending portions 153E extending between the first nanostructure 150A or 150B and the second spacer element 147', and a length L1 of the extending portion 153E is between about 1 nm and about 3 nm. In some embodiments, the length L1 of the extending portion 153E is less than 1 nm. In some embodiments, the first spacer element 149 is between two extending portions 153E. In some embodiments, the extending portions 153E may be used for short channel effect (SCE) control. In some embodiments, the thickness T1 of the first spacer element 149 is between about 2 nm and about 5 nm. In some embodiments, the thickness T2 of the second spacer element 147' is between about 2 nm and about 10 nm. In some embodiments, the thickness T3 of the gate dielectric layer 153 is between about 0.5 nm and about 2 nm.

As shown in FIG. 2I, the gate electrode layer 154 of the gate structures 151A or 151B extend in a first direction, and the nanostructures 150 and the isolation structures 155 extend in a second direction, and the first direction and the second direction are different (e.g. substantially perpendicular), in accordance with some embodiments of the present disclosure.

Figures 1, 3A:
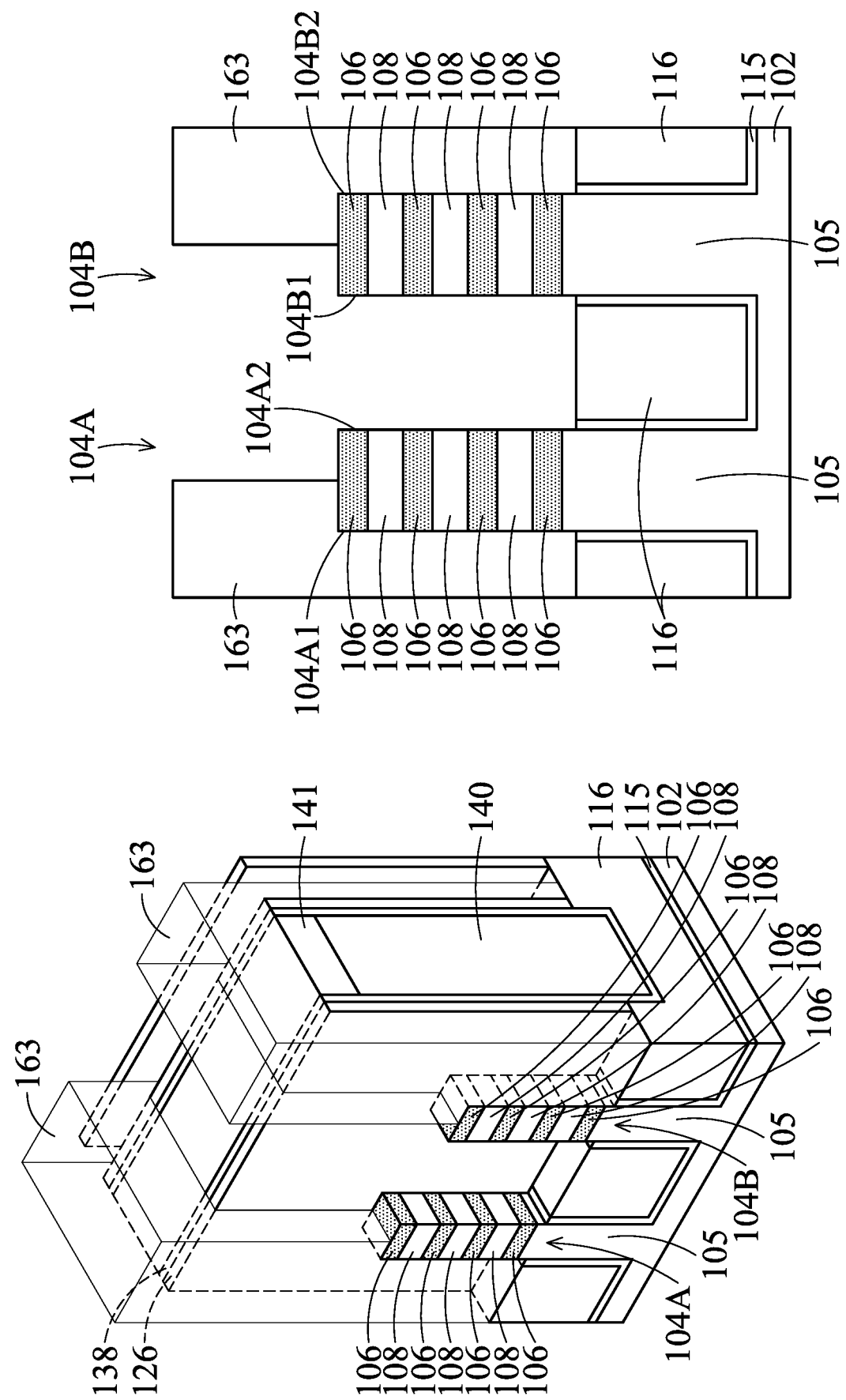
Figures 1, 3B:
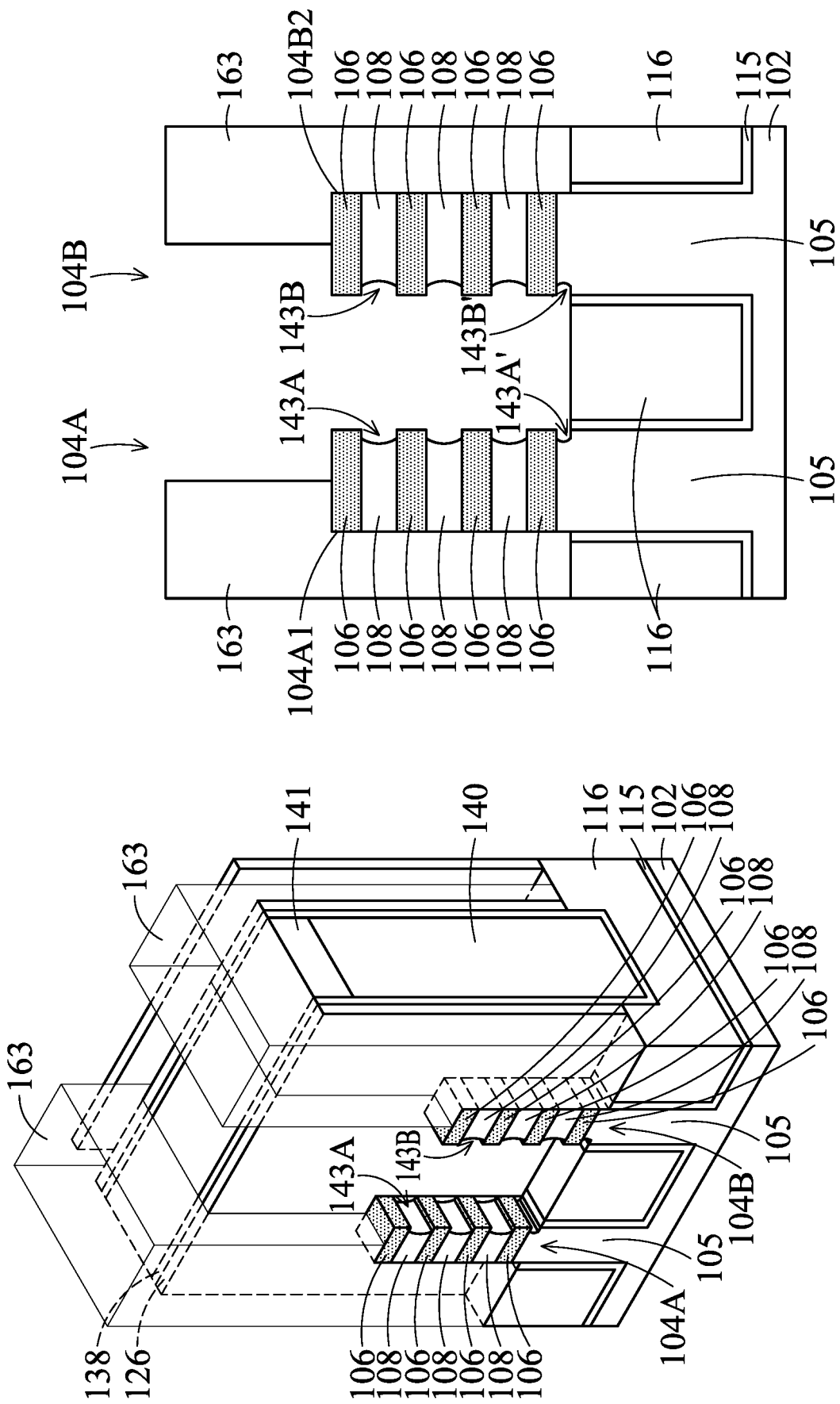

In some embodiments, the first spacer element 149 and the second spacer element 147' may be selectively formed on specific sides of the nanostructures 150A or 150B. For example, FIGS. 3A and 3B are perspective cross-sectional views of intermediate stages of manufacturing a semiconductor structure illustrated along the line A-A in FIG. 1I after the step shown in FIG. 1K in accordance with some embodiments. FIGS. 3A-1, 3B-1, 3C, 3D, 3E, 3F, 3G, and 3H are cross-sectional views of intermediate stages of manufacturing a semiconductor structure illustrated along the line A-A in FIG. 1I after the step in FIG. 3B in accordance with some embodiments. FIGS. 3C-1, 3D-1, 3E-1, 3F-1, and 3G-1 are enlarged views of FIGS. 3C, 3D-3E, 3F, and 3G in accordance with some embodiments, respectively.

As shown in FIGS. 3A and 3A-1, a patterned photoresist layer 163 is formed on the fin structures 104A and 104B after removing the dummy gate dielectric layers 120 to cover a portion of the fin structures 104A and 104B. For example, the fin structure 104A (including the first semiconductor material layers 106 and the second semiconductor material layers 108) has a sidewall 104A1 facing away from the fin structure 104B and a sidewall 104A2 facing the fin structure 104B, and the fin structure 104B has a sidewall 104B1 facing away from the fin structure 104A and a sidewall 104B2 facing the fin structure 104A, in accordance with some embodiments. In some embodiments, the patterned photoresist layer 163 covers the sidewalls 104A1 and 104B2, and the sidewalls 104A2 and 104B1 are exposed from the patterned photoresist layer 163. In some embodiments, the material of the patterned photoresist layer 163 may include SiN or SiCN. In some embodiments, the patterned photoresist layer 163 may be formed by chemical vapor deposition (CVD), physical vapor deposition, (PVD), atomic layer deposition (ALD), or other applicable processes.

In some embodiments, as shown in FIGS. 3B and 3B-1, an etching process is performed to selectively form concave portions 143 on sidewalls of the second semiconductor material layers 108, such as recessing the second semiconductor material layers 108 from the sidewalls 104A2 and 104B1. In some embodiments, the base fin structure 105 exposed from the isolation structure 116 is also recessed to form concave portions 143A' and 143B' on the fin structures 104A and 104B, respectively. In some embodiments, the concave portions 143A and 43B and the concave portions 143A' and 143B' have different sizes (e.g. heights). In some embodiments, the concave portions 143A, 143B, 143A', and 143B' may have a depth between about 2 nm and about 10 nm.

In some embodiments, the etching process may be any acceptable etch process, such as a reactive ion etch (RIE), neutral beam etch (NBE), the like, or a combination thereof. In some embodiments, the etching process may be anisotropic.

In some embodiments, as shown in FIG. 3C and FIG. 3C-1, the patterned photoresist layer 163 is removed after recessing the second semiconductor material layers 108 from the sidewalls 104A2 and 104B1, and then a first dielectric layer 145 is conformally formed on the fin structures 104A and 104B and the isolation structure 116, and in the concave portions 143A, 143A', 143B, and 143B', in accordance with some embodiments. Afterwards, a second dielectric layer 147 is conformally formed on the first dielectric layer 145, in accordance with some embodiments. In some embodiments, the second dielectric layer 147 does not fully fill the concave portions 143A and 143B, but gaps 148 may be formed on the second dielectric layer 147 and corresponding to the concave portions 143A and 143B, such as arranged with the concave portions 143A and 143B in the first direction. In some embodiments, the first dielectric layer 145 or the second dielectric layer 147 may be selectively omitted, depending on design requirement. In some embodiments, the materials of the first dielectric layer 145 and the second dielectric layer 147 may include dielectric materials, such as material with dielectric constant greater than 7. In some embodiments, the materials of the first dielectric layer 145 and the second dielectric layer 147 may include $SiO_2$, SiN, SiCN, SiOC, SiOCN, or other applicable materials. In some embodiments, the first dielectric layer 145 and the second dielectric layer 147 may include different materials.

In some embodiments, the formation methods of the first dielectric layer 145 and the second dielectric layer 147 may include Molecular-Beam Deposition (MBD), Atomic Layer Deposition (ALD), Chemical vapor deposition (CVD), and the like.

Next, as shown in FIG. 3D and FIG. 3D-1, the second dielectric layer 147 outside the concave portions 143A, 143A', 143B, and 143B' is removed to form second spacer elements 147' in the concave portions 143A, 143A', 143B, and 143B' in accordance with some embodiments. In some embodiments, each of the second spacer elements 147' has curved surfaces 147A and 147B. In some embodiments, the curved surface 147A faces away from the second semiconductor material layers 108, and the curved surface 147B faces the second semiconductor material layers 108 and in contact with the first dielectric layer 145. During the removal of the second dielectric layer 147, the first dielectric layer 145 is not removed, in accordance with some embodiments.

In some embodiments, the removal process of the second dielectric layer 147 may include any acceptable etch process, such as a reactive ion etch (RIE), neutral beam etch (NBE), the like, or a combination thereof. In some embodiments, the etching process may be anisotropic.

In some embodiments, the first dielectric layer 145 outside the concave portions 143 and 143' are removed, and the remaining first dielectric layer 145 becomes first dielectric layer 145' in the concave portions 143 and 143' and between the second spacer elements 147' and the second semiconductor material layers 108, as shown in FIGS. 3E and 3E-1. In some embodiments, each of the first semiconductor material layers 106 has sidewalls 106A and 106B, and the first dielectric layer 145' and the second spacer elements 147' are partially protrude from the sidewall 106A.

In some embodiments, the removal process of the first dielectric layer 145 may include any acceptable etch process, such as a reactive ion etch (RIE), neutral beam etch (NBE), the like, or a combination thereof. In some embodiments, the etching process may be anisotropic.

Next, as shown in FIGS. 3F and 3F-1, the first semiconductor material layers 106 are removed to form nanostructures 150A and 150B with the second semiconductor material layers 108 in accordance with some embodiments. In some embodiments, a portion of the first dielectric layer 145' is removed to form first spacer elements 149. In some embodiments, the entire first dielectric layer 145' is removed. In some embodiments, the removal process may include one or more etching processes. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

After the nanostructures 150A and 150B are formed, gate structures 151A and 151B are formed to respectively wrap around the nanostructures 150A and 150B, as shown in FIGS. 3G and 3G-1 in accordance with some embodiments. The gate structures 151A and 151B respectively wrap around the nanostructures 150A and 150B to form gate-all-around transistor structures in accordance with some embodiments. In some embodiments, each of the gate structures 151A and 151B includes an interfacial layer 152, a gate dielectric layer 153, and a gate electrode layer 154.

In some embodiments, the interfacial layers 152 are oxide layers formed around the nanostructures 150A and 150B and on the top of the base fin structure 105. In some embodiments, the interfacial layers 152 are formed by performing a thermal process.

In some embodiments, the gate dielectric layers 153 are formed over the interfacial layers 152, so that the nanostructures 150A and 150B are surrounded (e.g. wrapped) by the gate dielectric layers 153. In some embodiments, the nanostructures 150A and 150B and the gate dielectric layers 153 are separated by the first spacer element 149 and the interfacial layers 152.

In some embodiments, the gate dielectric layers 153 are made of one or more layers of dielectric materials, such as HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, another suitable high-k dielectric material, or a combination thereof. In some embodiments, the gate dielectric layers 153 are formed using CVD, ALD, another applicable method, or a combination thereof.

In some embodiments, the gate electrode layers 154 are formed on the gate dielectric layer 153. In some embodiments, the gate electrode layer 154 of the gate structures 151A and 151B may be formed concurrently or formed in separate processes, and may include identical or different materials. In some embodiments, the gate electrode layers 154 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 154 are formed using CVD, ALD, electroplating, another applicable method, or a combination thereof. Other conductive layers, such as work function metal layers, may also be formed in the gate structures 151A and 151B, although they are not shown in the figures.

Figure 3H:
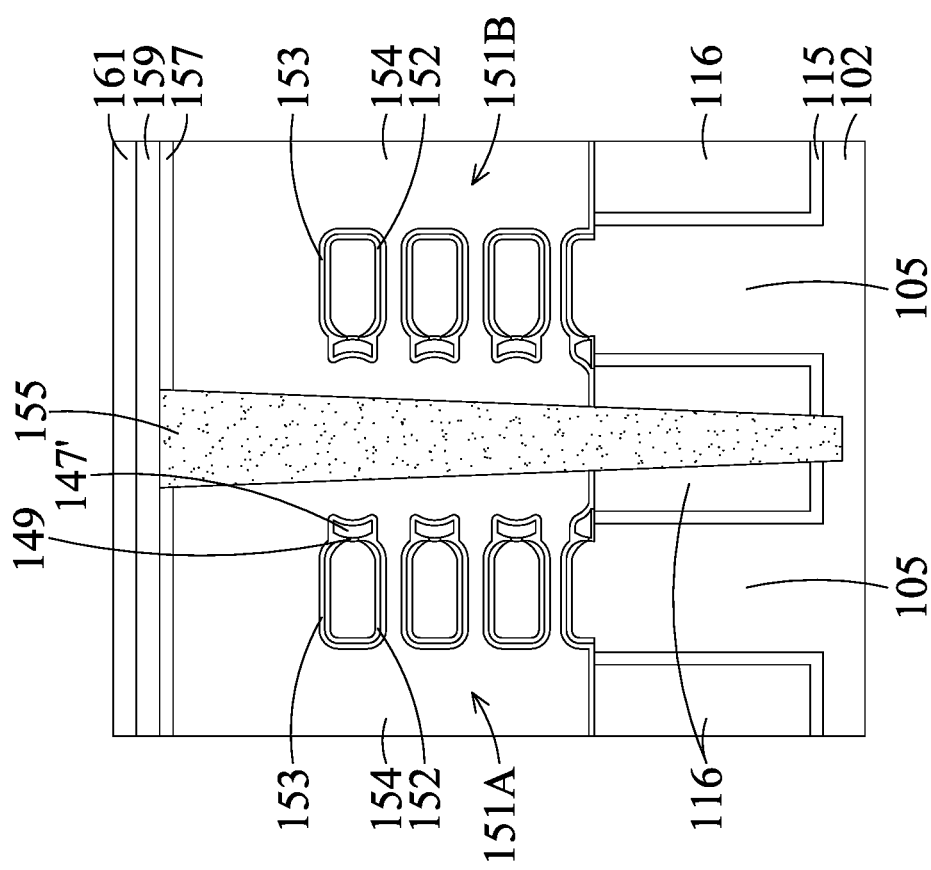
FIG. 3H is a cross-sectional view of intermediate stages of manufacturing a semiconductor structure illustrated along the line A-A in FIG. 1I in accordance with some embodiments.
Figure 4:
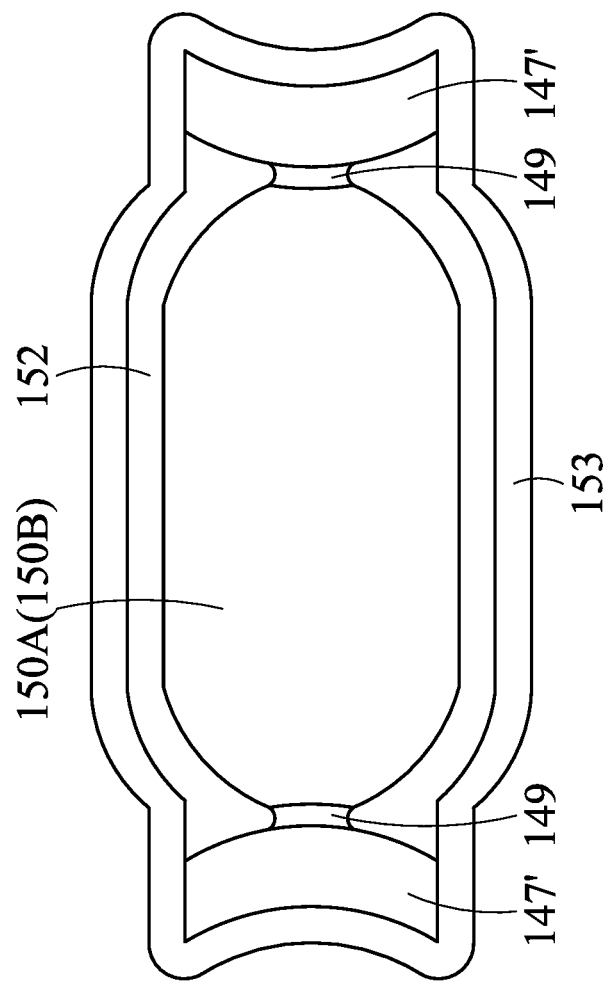

FIG. 3H is a cross-sectional view of intermediate stages of manufacturing a semiconductor structure illustrated along the line A-A in FIG. 1I in accordance with some embodiments. In some embodiments, a conductive layer 157 is formed over the gate structures 151A and 151B, and then an isolation structure 155 is formed penetrating the conductive layer 157 and between the gate structures 151A and 151B to divide (e.g., cut or separate) the gate structures 151A and 151B into sub-metal gate structures 151A and 151B, as shown in FIG. 3H. For example, an opening is formed between the gate structures 151A and 151B, and then dielectric material is filled into the opening to form the isolation structure 155. In some embodiments, the isolation structure 155 includes SiO$_2$, SiON, SiN, SiC, SiOC, SiOCN, or low-k materials as needed.

In some embodiments, a dielectric layer 159 and a dielectric layer 161 are formed over the conductive layer 157. In some embodiments, the dielectric layer 159 and the dielectric layer 161 may be formed by suitable deposition processes, such as CVD, ALD, physical vapor deposition (PVD), another suitable method, or a combination thereof.

Afterwards, in some embodiments, contacts 160A and 160B are formed over the source/drain structures 136A and 136B, and vias 162 are formed over the gate structure 151A to form the semiconductor structure 100, which is similar to the structure shown in FIG. 2H, and the details are not repeated.

In some embodiments, the extending portions 153E of the gate dielectric layer 153 may be omitted. For example, FIG. 4 is an enlarged view of the nanostructure 150 in accordance with some embodiments. As shown in FIG. 4, the gate dielectric layer 153 does not extend between the second spacer element 147' and the nanostructure 150, and the interfacial layer 152 surrounds the nanostructure 150, in accordance with some embodiments.

Figure 5:
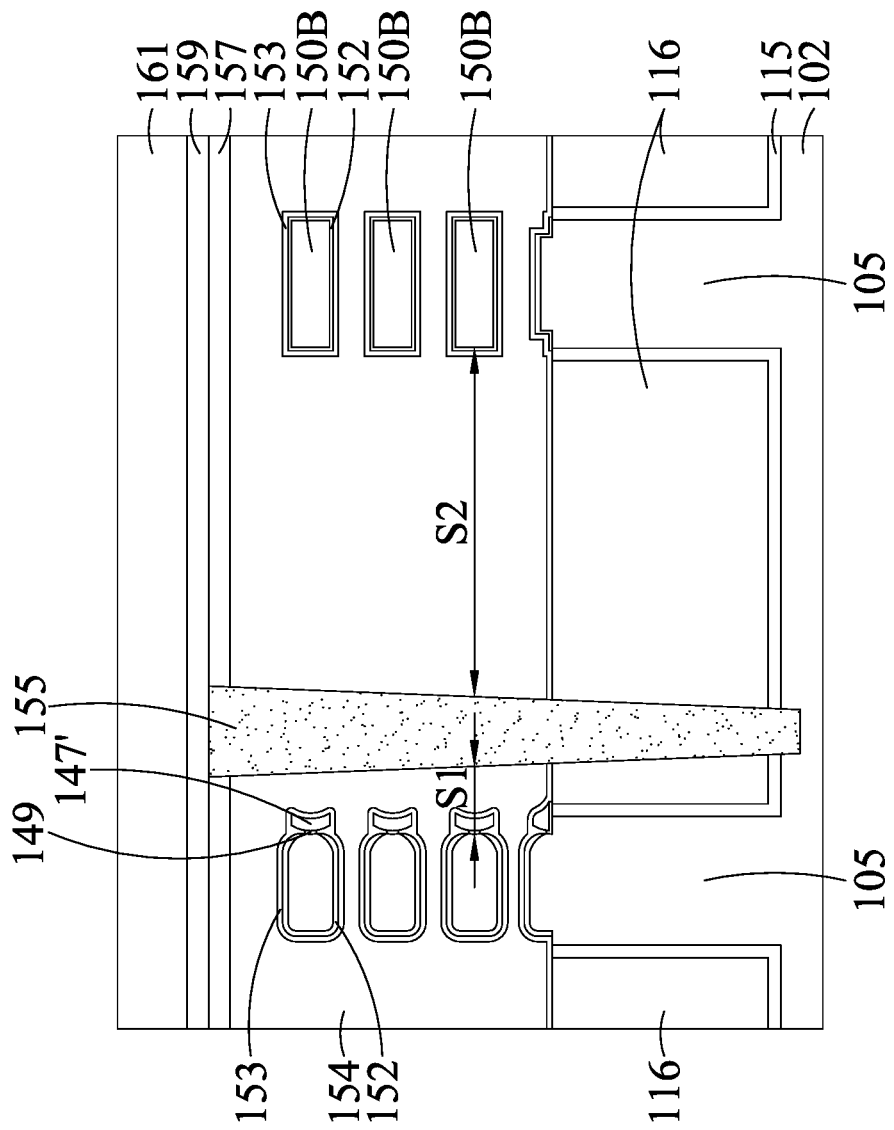
FIG. 5 is a cross-sectional view of intermediate stages of manufacturing a semiconductor structure illustrated along the line A-A in FIG. 1I in accordance with some embodiments.

In some embodiments, the dielectric spacer (including the first spacer element 149 and the second spacer element 147') may be formed on one of two adjacent fin structures (e.g. the fin structure 104A), and does not form on another fin structure (e.g. the fin structure 104B). FIG. 5 is a cross-sectional view of intermediate stages of manufacturing a semiconductor structure illustrated along the line A-A in FIG. 1I in accordance with some embodiments. Such structure may be obtained by forming the patterned photoresist layer 163 on the fin structures 104A and 104B (e.g. see FIG. 3A) to cover the sidewalls 104A1, 104B1, and 104B2, and the sidewall 104A2 may be exposed from the patterned photoresist layer 163, followed by subsequent processes in FIGS. 3B-3H, in accordance with some embodiments of the present disclosure. As shown in FIG. 5, the first spacer element 149 and the second spacer element 147' form on the nanostructures 150A, rather than form on the nanostructures 150B, in accordance with some embodiments. In such embodiment, the isolation structure 155 may be formed adjacent to the nanostructures 150A. For example, the distance SI between the nanostructure 150A (the fin structure 104A) and the isolation structure 155 may be less than the distance S2 between the nanostructure 150B (the fin structure 104B) and the isolation structure 155, so the space between the nanostructure 150A and the isolation structure 155 may be reduced for miniaturization, in accordance with some embodiments.

In summary, a semiconductor structure and a method for manufacturing the same are provided in some embodiments. By forming dielectric spacers in the concave portions of the nanostructures, the distance between the isolation structure and the nanostructure may be reduced, the capacitance may be reduced, and the device density and the power efficiency may be enhanced, in accordance with some embodiments of the present disclosure.

A method for manufacturing a semiconductor structure is provided in some embodiments of the present disclosure. The method includes forming a fin structure protruding from a substrate, wherein the fin structure includes first semiconductor material layers and second semiconductor material layers alternately stacked, forming a dummy gate structure across the fin structure, forming a gate spacer on the sidewall of the dummy gate structure, removing the dummy gate structure to expose the fin structure, partially removing the second semiconductor material layers to form concave portions on sidewalls of the second semiconductor material layers, forming dielectric spacers in the concave portions, removing the first semiconductor material layers to form gaps, and forming a gate structure in the gaps to wrap around the second semiconductor material layers and the dielectric spacers.

A method for manufacturing a semiconductor structure is provided in some embodiments of the present disclosure. The method includes the following steps. The method includes alternately stacking first semiconductor material layers and second semiconductor material layers to form a semiconductor stack over a substrate. The method includes patterning the semiconductor stack to form a first fin structure and a second fin structure. The method includes recessing the second semiconductor material of the first fin structure and the second fin structure to form first concave portions in the first fin structure and second concave portions in the second fin structure. The method includes forming a first dielectric layer surrounding the first fin structure and the second fin structure. The method includes forming a second dielectric layer surrounding the first dielectric layer. The method includes partially removing the first dielectric layer and the second dielectric layer to form first dielectric spacers in the first concave portions and to form second dielectric spacers in the second concave portions. The method includes removing the first semiconductor material layers. The method includes forming a gate structure wrapped around the second semiconductor material layers and the dielectric spacers.

A semiconductor structure is provided in some embodiments of the present disclosure. The semiconductor structure includes a substrate, a gate structure, a first nanostructure, a source/drain structure, and a first dielectric spacer. The gate structure extends over the substrate in a first direction. The first nanostructure extends in a second direction, wherein the second direction is different from the first direction. The source/drain structure is formed adjacent to the gate structure over the substrate. The first dielectric spacer is attached to the sidewall of the first nanostructure. The first dielectric spacer includes a first spacer element in contact with the first nanostructure, and a second spacer element in contact with the first spacer element. In a cross-sectional view, the first spacer element is between the first nanostructure and the second spacer element in the first direction, and the height of the first spacer element is less than the height of the first nanostructure and the height of the second spacer element in the third direction. The third direction is different from the first direction and the second direction. The first nanostructure and the first dielectric spacer are wrapped by the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a fin structure protruding from a substrate, wherein the fin structure comprises first semiconductor material layers and second semiconductor material layers alternately stacked;
    forming a dummy gate structure across the fin structure;
    forming a gate spacer on a sidewall of the dummy gate structure;
    removing the dummy gate structure to expose the fin structure;
    forming a patterned photoresist layer on the fin structure after removing the dummy gate structure, wherein first sidewalls of the second semiconductor material layers are covered by the patterned photoresist layer, and second sidewalls of the second semiconductor material layers opposite from the first sidewalls are exposed from the patterned photoresist layer;
    partially removing the second semiconductor material layers to form concave portions on sidewalls of the second semiconductor material layers;
    forming dielectric spacers in the concave portions;
    removing the first semiconductor material layers to form gaps; and
    forming a gate structure in the gaps to wrap around the second semiconductor material layers and the dielectric spacers.

2. The method as claimed in claim 1, wherein forming the dielectric spacers comprises:
    forming a first dielectric layer surrounding the fin structure;
    forming a second dielectric layer surrounding the first dielectric layer; and
    removing portions of the first dielectric layer and the second dielectric layer outside the concave portions.

3. The method as claimed in claim 2, wherein a height of the first dielectric layer is greater than a height of the second dielectric layer before removing the first semiconductor material layers, and the height of the first dielectric layer is less than the height of the second dielectric layer after removing the first semiconductor material layers.

4. The method as claimed in claim 2, wherein the first dielectric layer surrounds the second dielectric layer in the dielectric spacers.

5. The method as claimed in claim 1, wherein partially removing the second semiconductor material layers comprises recessing the second semiconductor material layers from the second sidewalls.

6. The method as claimed in claim 1, further comprising removing the patterned photoresist layer after recessing the second semiconductor material layers from the second sidewalls.

7. The method as claimed in claim 1, further comprising forming a gate dielectric surrounding the second semiconductor material layers and the dielectric spacers and extending between the second semiconductor material layers and the dielectric spacers.

8. A method for manufacturing a semiconductor structure, comprising:
    alternately stacking first semiconductor material layers and second semiconductor material layers to form a semiconductor stack over a substrate;
    patterning the semiconductor stack to form a first fin structure and a second fin structure;
    forming a patterned photoresist layer over the first fin structure and the second fin structure, wherein the first fin structure has a first sidewall and a second sidewall opposite from each other, the second fin structure has a third sidewall and a fourth sidewall opposite from each other, and the second sidewall faces the third sidewall;
    recessing the second semiconductor material of the first fin structure and the second fin structure to form first concave portions in the first fin structure and second concave portions in the second fin structure;
    forming a first dielectric layer surrounding the first fin structure and the second fin structure;
    forming a second dielectric layer surrounding the first dielectric layer;
    partially removing the first dielectric layer and the second dielectric layer to form first dielectric spacers in the first concave portions and to form second dielectric spacers in the second concave portions;
    removing the first semiconductor material layers; and
    forming a gate structure wrapped around the second semiconductor material layers and the dielectric spacers.

9. The method as claimed in claim 8, wherein the first sidewall and the fourth sidewall are covered by the patterned photoresist layer, and the second sidewall and the third sidewall are exposed from the patterned photoresist layer.

10. The method as claimed in claim 8, wherein the first sidewall, the third sidewall, and the fourth sidewall are covered by the patterned photoresist layer, and the second sidewall is exposed from the patterned photoresist layer.

11. The method as claimed in claim 10, further comprising forming an isolation structure between the first fin structure and the second fin structure, and a distance between the first fin structure and the isolation structure is less than a distance between the second fin structure and the isolation structure.

12. The method as claimed in claim 8, wherein the first concave portions are formed on opposite sides of the first fin structure.

13. The method as claimed in claim 8, wherein a gap is formed in the second dielectric layer before partially removing the first dielectric layer and the second dielectric layer.

14. A semiconductor structure, comprising:
a substrate;
a gate structure extending in a first direction over the substrate;
a first nanostructure extending in a second direction, wherein the second direction is different from the first direction;
a second nanostructure laterally aligned with the first nanostructure and wrapped by the gate structure, wherein a distance between the first nanostructure and the second nanostructure is between 30 nm and 46 nm;
a source/drain structure formed adjacent to the gate structure over the substrate;
a first dielectric spacer attached to a sidewall of the first nanostructure, wherein the first dielectric spacer comprises:
a first spacer element in contact with the first nanostructure; and
a second spacer element in contact with the first spacer element, wherein in a cross-sectional view, the first spacer element is between the first nanostructure and the second spacer element in the first direction, and a height of the first spacer element is less than a height of the first nanostructure and a height of the second spacer element in a third direction that is different from the first direction and the second direction;
wherein the first nanostructure and the first dielectric spacer are wrapped by the gate structure.

15. The semiconductor structure as claimed in claim 14, further comprising a second dielectric spacer attached to a sidewall of the second nanostructure, wherein the second dielectric spacer comprises:
a third spacer element in contact with the second nanostructure; and
a fourth spacer element in contact with the third spacer element, wherein the fourth spacer element is between the first nanostructure and the second nanostructure.

16. The semiconductor structure as claimed in claim 14, wherein a thickness of the first spacer element is between 2 nm and 5 nm.

17. The semiconductor structure as claimed in claim 14, wherein the gate structure comprises a gate dielectric surrounding the first nanostructure, wherein the gate dielectric comprises a first extending portion extending between the first nanostructure and the second spacer element, and a length of the first extending portion is between 1 nm and 3 nm.

18. The semiconductor structure as claimed in claim 17, further comprising an interfacial layer between the first nanostructure and the gate dielectric, and the gate dielectric and the first spacer element are separated by the interfacial layer.

19. The semiconductor structure as claimed in claim 17, wherein the gate dielectric further comprises a second extending portion extending between the first nanostructure and the second spacer element, and the first spacer element is between the first extending portion and the second extending portion.

20. The semiconductor structure as claimed in claim 14, wherein the first nanostructure has a curved surface.

* * * * *